US009184209B2

(12) United States Patent
Onakado et al.

(10) Patent No.: US 9,184,209 B2
(45) Date of Patent: Nov. 10, 2015

(54) TDI-TYPE LINEAR IMAGE SENSOR

(71) Applicants: Takahiro Onakado, Chiyoda-ku (JP); Junji Nakanishi, Chiyoda-ku (JP)

(72) Inventors: Takahiro Onakado, Chiyoda-ku (JP); Junji Nakanishi, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/345,834

(22) PCT Filed: Sep. 24, 2012

(86) PCT No.: PCT/JP2012/074343
§ 371 (c)(1),
(2) Date: Mar. 19, 2014

(87) PCT Pub. No.: WO2013/054654
PCT Pub. Date: Apr. 18, 2013

(65) Prior Publication Data
US 2014/0217476 A1 Aug. 7, 2014

(30) Foreign Application Priority Data
Oct. 14, 2011 (JP) ................................. 2011-226957

(51) Int. Cl.
H01L 27/148 (2006.01)
H01L 27/146 (2006.01)
(52) U.S. Cl.
CPC .... H01L 27/14825 (2013.01); H01L 27/14627 (2013.01); H01L 27/14806 (2013.01); H01L 27/14843 (2013.01)
(58) Field of Classification Search
CPC .................................................. H01L 27/14627

USPC .................. 257/234, 292, 223, 225; 348/311
See application file for complete search history.

(56) References Cited

U.S. PATENT DOCUMENTS

| 6,465,820 B1 * | 10/2002 | Fox .............................. 257/223 |
| 7,276,749 B2 * | 10/2007 | Martin et al. ................. 257/292 |
| 7,851,826 B2 * | 12/2010 | Hernandez .................... 257/234 |
| 8,748,954 B2 * | 6/2014 | Mayer .......................... 257/292 |

(Continued)

FOREIGN PATENT DOCUMENTS

| JP | 2001 102560 | 4/2001 |
| JP | 2005 57552 | 3/2005 |
| JP | 2005 509510 | 4/2005 |
| JP | 2005 166810 | 6/2005 |

(Continued)

OTHER PUBLICATIONS

International Search Report Issued Nov. 13, 2012 in PCT/JP12/074343 Filed Sep. 24, 2012.

Primary Examiner — Yu-Hsi D Sun
Assistant Examiner — Chi-Hua Yang
(74) Attorney, Agent, or Firm — Oblon, McClelland, Maier & Neustadt, L.L.P.

(57) ABSTRACT

In a TDI-type linear image sensor in which pixels are constituted of CCDs (Charge Coupled Devices) of n phases (n being an integer not smaller than 3), a gate opening portion and a gate non-opening portion functioning as a TDI transfer channel (15) are formed in all of transfer gates of the CCDs of n phases constituting the pixels. Within one pixel pitch in a TDI transfer direction, n microlenses (18) are formed such that light is concentrated at the gate non-opening portion formed at the transfer gate of each phase.

16 Claims, 28 Drawing Sheets

(56) References Cited

U.S. PATENT DOCUMENTS

| | | |
|---|---|---|
| 2004/0267488 A1 | 12/2004 | Strommer |
| 2005/0128330 A1 | 6/2005 | Hamada et al. |
| 2007/0064137 A1* | 3/2007 | Kanbe .......................... 348/311 |
| 2007/0145426 A1* | 6/2007 | Kim .............................. 257/234 |
| 2011/0317052 A1 | 12/2011 | Kieft |
| 2012/0069211 A1 | 3/2012 | Takemura et al. |

FOREIGN PATENT DOCUMENTS

| | | |
|---|---|---|
| JP | 2010 258155 | 11/2010 |
| JP | 2010 278295 | 12/2010 |
| WO | 2010 103448 | 9/2010 |

* cited by examiner

TDI-TYPE LINEAR IMAGE SENSOR

TECHNICAL FIELD

The present invention relates to a TDI-type linear image sensor used in such a field as remote sensing.

BACKGROUND ART

An image sensor having a large number of photodetectors arranged in an array on a semiconductor substrate and including a circuit for reading signal charges and an output amplifier on the same substrate has been developed. In remote sensing, a linear image sensor in which photodetectors are arranged in a one-dimensional array is mounted on an artificial satellite or the like and a direction perpendicular to the array is matched with a direction in which the satellite moves, so that a two-dimensional image of the surface of the Earth is photographed.

Though a pixel pitch is desirably minimized in order to improve resolution of an image, a quantity of incident light decreases in correspondence with decrease in area of photodetectors and S/N disadvantageously lowers.

As ingenious measures for improving S/N, a TDI (Time Delay and Integration)-type image sensor has been developed. TDI is a reading technique for improving S/N by employing an FFT (full frame transfer)-type CCD (Charge Coupled Device) which is a two-dimensional image sensor and synchronizing timing of charge transfer with timing of movement of an image of a subject. In the case of remote sensing, a TDI operation can be realized by matching charge transfer in a vertical direction to a moving speed of a satellite. When TDI operations in M stages are performed in a vertical CCD, an accumulation time period increases effectively by M-fold, and hence sensitivity improves by M-fold and S/N improves by $\sqrt{M}$-fold.

In many cases, a visible image sensor picks up an image by allowing light to be incident on a chip surface side. Incident light is photoelectrically converted within a silicon substrate and produces signal charges. In the FFT-type CCD, however, light is incident through a polysilicon electrode which controls vertical charge transfer. Therefore, light particularly in a region of a short wavelength is absorbed by the polysilicon electrode and sensitivity disadvantageously lowers.

In order to address this, an image sensor of which sensitivity has been improved by adopting what is called a VPCCD (virtual phase CCD) structure in which some vertical transfer gate electrodes are replaced with virtual electrodes has been proposed. The VPCCD can suppress light absorption in an electrode portion and achieve improved sensitivity by replacing a polysilicon electrode with a virtual electrode.

Japanese Patent Laying-Open No. 2001-102560 (PTD 1) discloses a solid-state image pick-up device aiming to suppress decrease in area of a light reception portion in an individual pixel, to improve pixel density, and to avoid difference in light gathering efficiency or sensitivity of a pixel between two pixel rows adjacent to each other.

In the solid-state image pick-up device in Japanese Patent Laying-Open No. 2001-102560 (PTD 1), a two-dimensional shape of a charge transfer channel for a vertical transfer CCD is meandered, a first transfer electrode and a second transfer electrode are employed as transfer electrodes for the vertical transfer CCD, each of reading gate regions adjacent to an odd-numbered charge transfer channel is formed to be adjacent to a portion where one transfer electrode of the first and second transfer electrodes and a charge transfer channel intersect two-dimensionally with each other, and each of reading gate regions adjacent to an even-numbered charge transfer channel is formed to be adjacent to a portion where the other transfer electrode of the first and second transfer electrodes and a charge transfer channel intersect two-dimensionally with each other.

CITATION LIST

Patent Document

PTD 1: Japanese Patent Laying-Open No. 2001-102560

SUMMARY OF INVENTION

Technical Problem

A case that, in order to improve sensitivity in a TDI-type linear image sensor having a VPCCD structure, by applying the technique in PTD 1, one microlens is formed in one pixel such that incident light is gathered onto a virtual electrode as shown in FIG. 1, is considered.

FIG. 1 shows a first TDI transfer gate 1, a second TDI transfer gate 2, a VPCCD virtual electrode 3, a third TDI transfer gate 4, a channel stop 5 formed from a high-concentration impurity region of a first conductivity type, a charge release drain 6 formed from a high-concentration impurity region of a second conductivity type, an impurity region 7 of the first conductivity type, a microlens 8, and an optical axis 9.

In the configuration in FIG. 1, light incident on a pixel is gathered onto VPCCD virtual electrode 3. Since virtual electrode 3 does not have a polysilicon electrode, light absorption by a polysilicon electrode portion can be avoided and sensitivity of the TDI-type linear image sensor is significantly improved.

When light is gathered onto an electrode of one phase with a microlens in the TDI-type linear image sensor, however, a resolution indicator MTF (Modulation Transfer Function) in a TDI transfer direction lowers. Lowering in MTF in the TDI transfer direction which takes place at the time when light is gathered onto an electrode of one phase will be described with reference to FIGS. 2, 3, and 4.

FIG. 2 is a schematic diagram illustrating a TDI operation of the TDI-type linear image sensor. For the sake of brevity, rather than a TDI-type linear image sensor having a VPCCD structure, a general 4-phase CCD having first to fourth TDI transfer gates will be described by way of example. Here, considering a subject of a bright pattern having one pixel length, a situation that a center of a subject having one pixel length coincides with a center of a CCD channel potential well is assumed as a case appropriate in considering MTF in the TDI transfer direction.

FIG. 2 represents channel potentials in states 1 to 4 of 4-phase drive.

State 1 of 4-phase drive is a state that a voltage setting a CCD channel to the High level is applied to the first TDI transfer gate and the second TDI transfer gate and a CCD channel potential well is formed under the first TDI transfer gate and the second TDI transfer gate.

State 2 of 4-phase drive is a state that a voltage setting a CCD channel to the High level is applied to the second TDI transfer gate and the third TDI transfer gate and a CCD channel potential well is formed under the second TDI transfer gate and the third TDI transfer gate.

State 3 of 4-phase drive is a state that a voltage setting a CCD channel to the High level is applied to the third TDI transfer gate and the fourth TDI transfer gate and a CCD channel potential well is formed under the third TDI transfer gate and the fourth TDI transfer gate.

State 4 of 4-phase drive is a state that a voltage setting a CCD channel to the High level is applied to the fourth TDI transfer gate and the first TDI transfer gate and a CCD channel potential well is formed under the fourth TDI transfer gate and the first TDI transfer gate.

As described previously, TDI is a reading method for improving S/N by synchronizing timing of charge transfer with timing of movement of an image of a subject. FIG. 2 also shows a manner that a subject pattern moves in synchronization with movement of a potential well.

In state 4 among the four states of this 4-phase drive, the center of the subject having one pixel length is located at a boundary between a target pixel and an adjacent pixel in a subsequent stage, more specifically, at a boundary between the fourth TDI transfer gate of the target pixel and the first TDI transfer gate of the adjacent pixel in the subsequent stage.

FIG. 3 illustrates in a schematic diagram, how light is incident in this state 4 in the case that light is not gathered onto an electrode of one phase with a microlens in the TDI-type linear image sensor and a position where charges generated as a result of a photoelectric effect are accumulated. Here again, similarly, for the sake of brevity, rather than a TDI-type linear image sensor having a VPCCD structure, a general 4-phase CCD having first to fourth TDI transfer gates is described by way of example, however, a phenomenon of lowering in MTF in the TDI transfer direction can be explained exactly similarly also in the TDI-type linear image sensor having the VPCCD structure.

When the center of the subject having one pixel length is located at the boundary between the target pixel and the adjacent pixel in the subsequent stage in the case that light is not gathered onto the electrode of one phase with the microlens, incident light moves forward as shown with an arrow drawn with a solid line in FIG. 3. FIG. 3 shows a position in a horizontal direction (a direction in parallel to the TDI transfer direction), of charges generated as a result of a photoelectric effect. The generated charges flow to the closest CCD channel potential well in the horizontal direction, as shown with an arrow drawn with a dotted line. Here, in considering MTF in the TDI transfer direction, it is appropriate to consider a situation that the center of the subject having one pixel length coincides with the center of the CCD channel potential well. Therefore, a case that a voltage setting a CCD channel to the High level is applied to the fourth TDI transfer gate and the first TDI transfer gate and a CCD channel potential well is created under the fourth TDI transfer gate and the first TDI transfer gate as in FIG. 3 is shown.

As shown in FIG. 3, it can be seen that all charges generated by incident light are gathered onto the CCD channel potential well directly under the subject in the case that light is not gathered onto the electrode of one phase with the microlens in the TDI-type linear image sensor.

On the other hand, as shown in FIG. 4, in a case that light is gathered onto the electrode of one phase with the microlens in the TDI-type linear image sensor (here, light is gathered onto the third TDI transfer gate in each pixel), charges generated by incident light are not gathered onto the CCD channel potential well directly under the subject but they flow to an adjacent CCD channel potential well in the subsequent stage. This phenomenon lowers MTF in the TDI transfer direction and lowers resolution in the TDI transfer direction. Consequently, a picked-up image blurs.

Therefore, an object of the present invention is to provide a TDI-type linear image sensor capable of simultaneously realizing higher sensitivity with a microlens and higher MTF.

Solution to Problem

The present invention is directed to a TDI-type linear image sensor in which pixels are constituted of CCDs (Charge Coupled Devices) of n phases (n being an integer not smaller than 3), and a gate opening portion and a gate non-opening portion functioning as a TDI transfer channel are formed in all CCD transfer gates of n phases constituting the pixels. Each of n microlenses is formed within one pixel pitch in a TDI transfer direction such that light is gathered onto the gate opening portion formed at the transfer gate of each phase.

Advantageous Effects of Invention

According to the TDI-type linear image sensor in the present invention, higher sensitivity with the use of a microlens and higher MTF can simultaneously be realized.

DESCRIPTION OF EMBODIMENTS

An embodiment of the present invention will be described hereinafter with reference to the drawings.

Embodiment 1

A configuration of a TDI-type linear image sensor in Embodiment 1 of the present invention will be described with reference to FIGS. 5 to 10.

Figure 1:
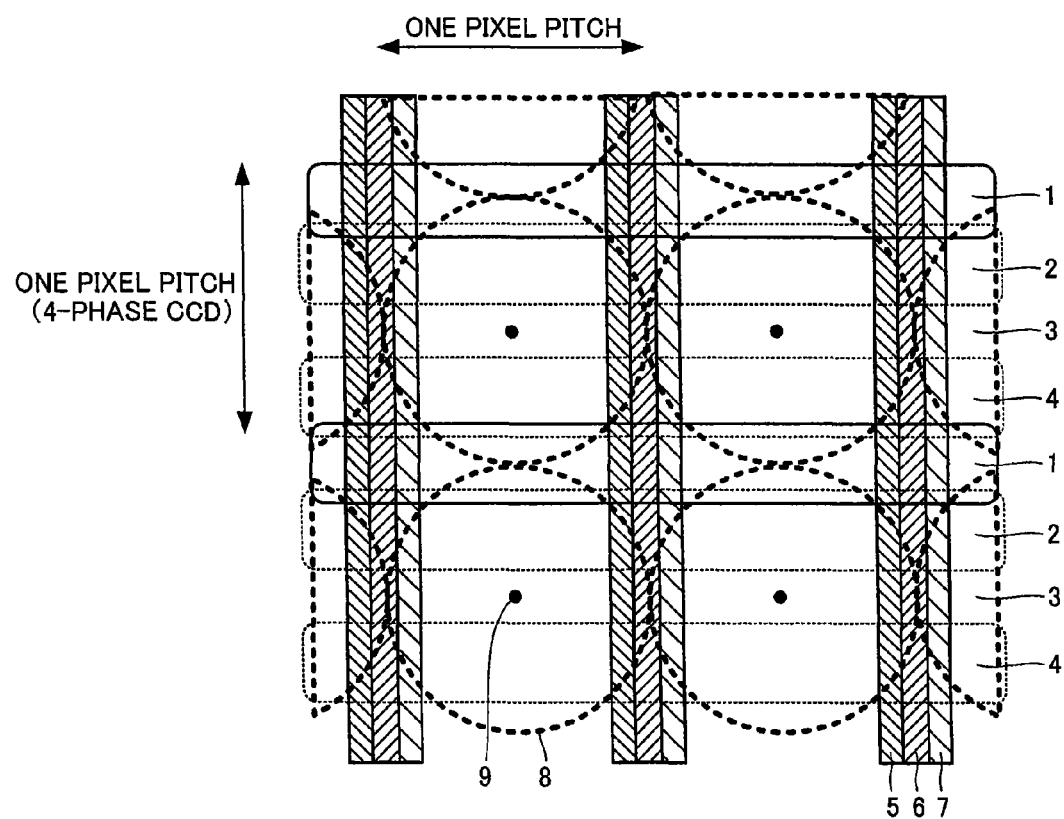
FIG. 1 is a plan view of a pixel in a TDI-type linear image sensor including a VPCCD structure, in which a microlens is formed such that incident light is gathered onto a virtual electrode.
Figure 2:
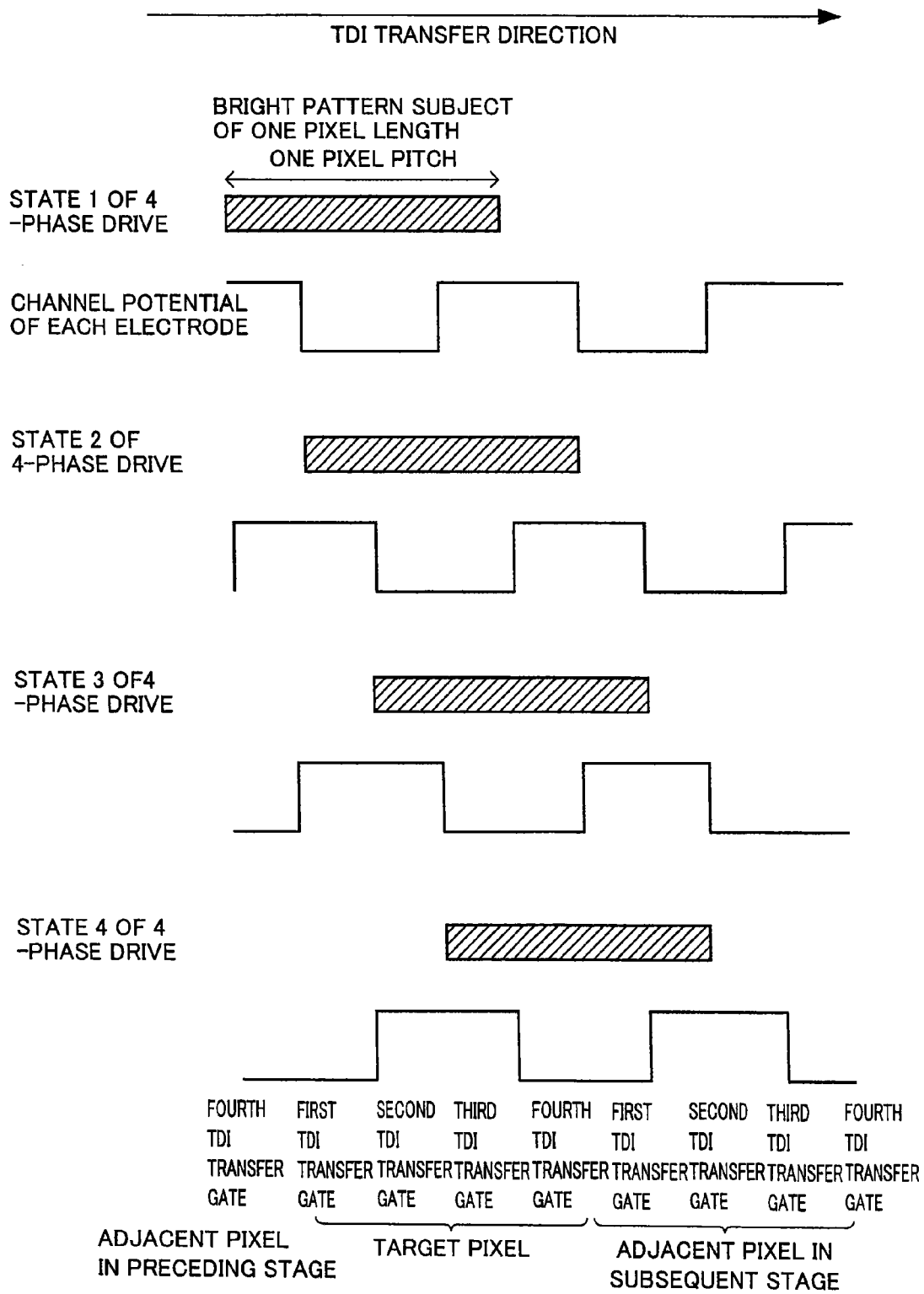
FIG. 2 is a schematic diagram illustrating a TDI operation of the TDI-type linear image sensor.
Figure 3:
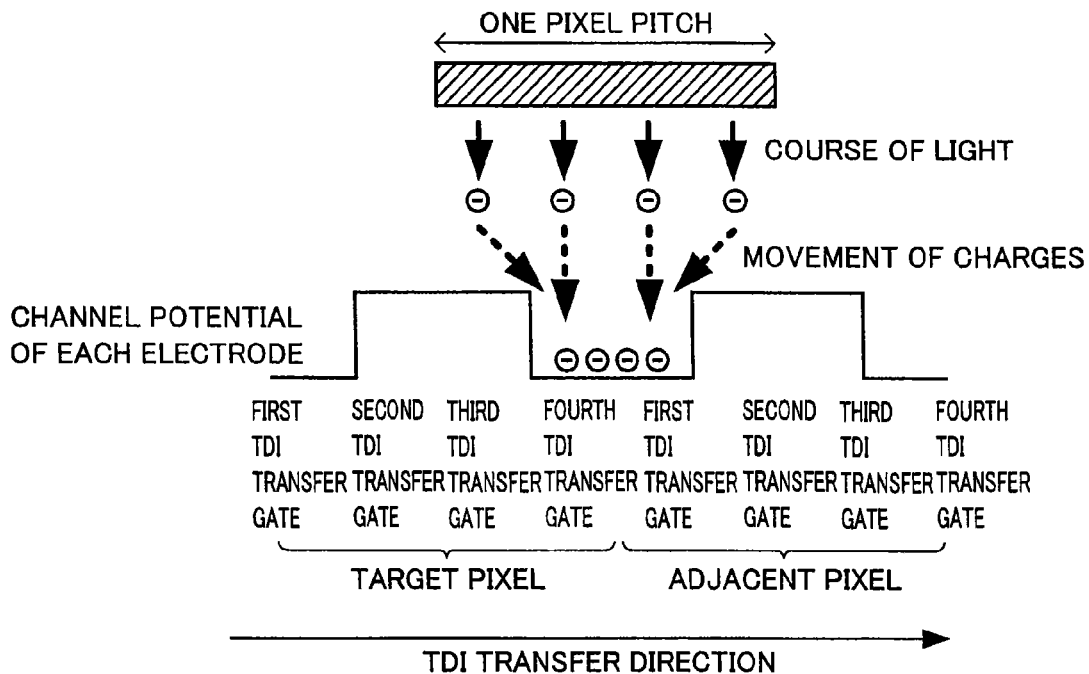
FIG. 3 is a schematic diagram illustrating a course of light and movement of charges in a case that light is not gathered onto an electrode of one phase with the microlens in the TDI-type linear image sensor.
Figure 4:
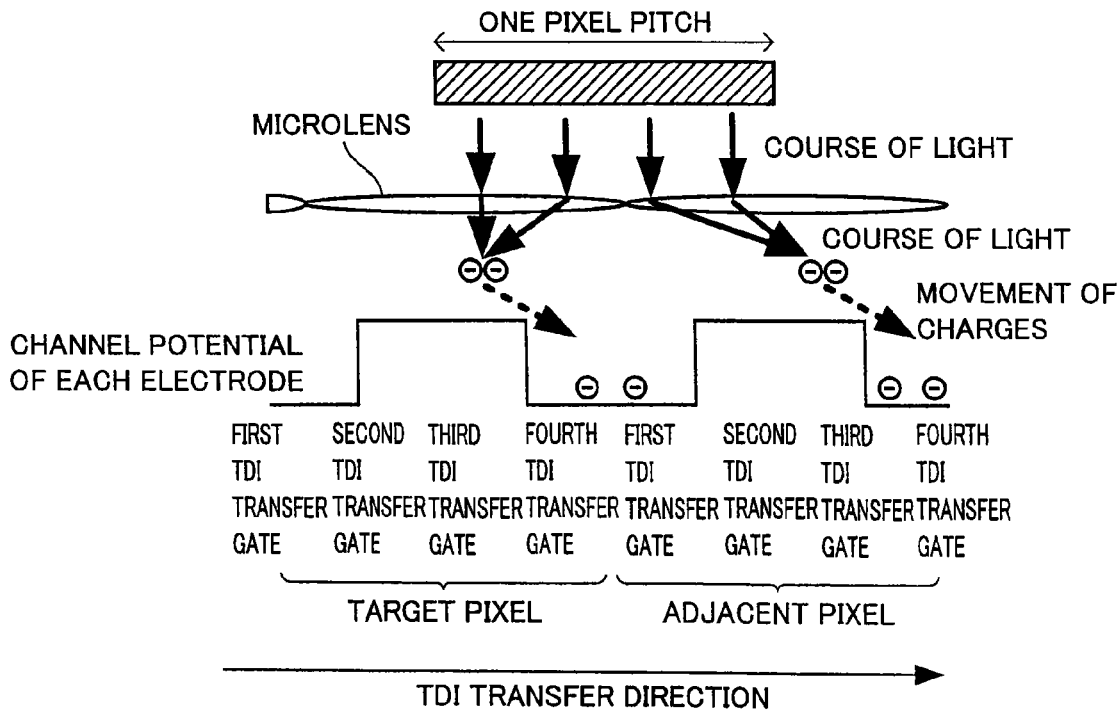
FIG. 4 is a schematic diagram illustrating a course of light and movement of charges in a case that light is gathered onto an electrode of one phase with the microlens in the TDI-type linear image sensor.
Figure 5:
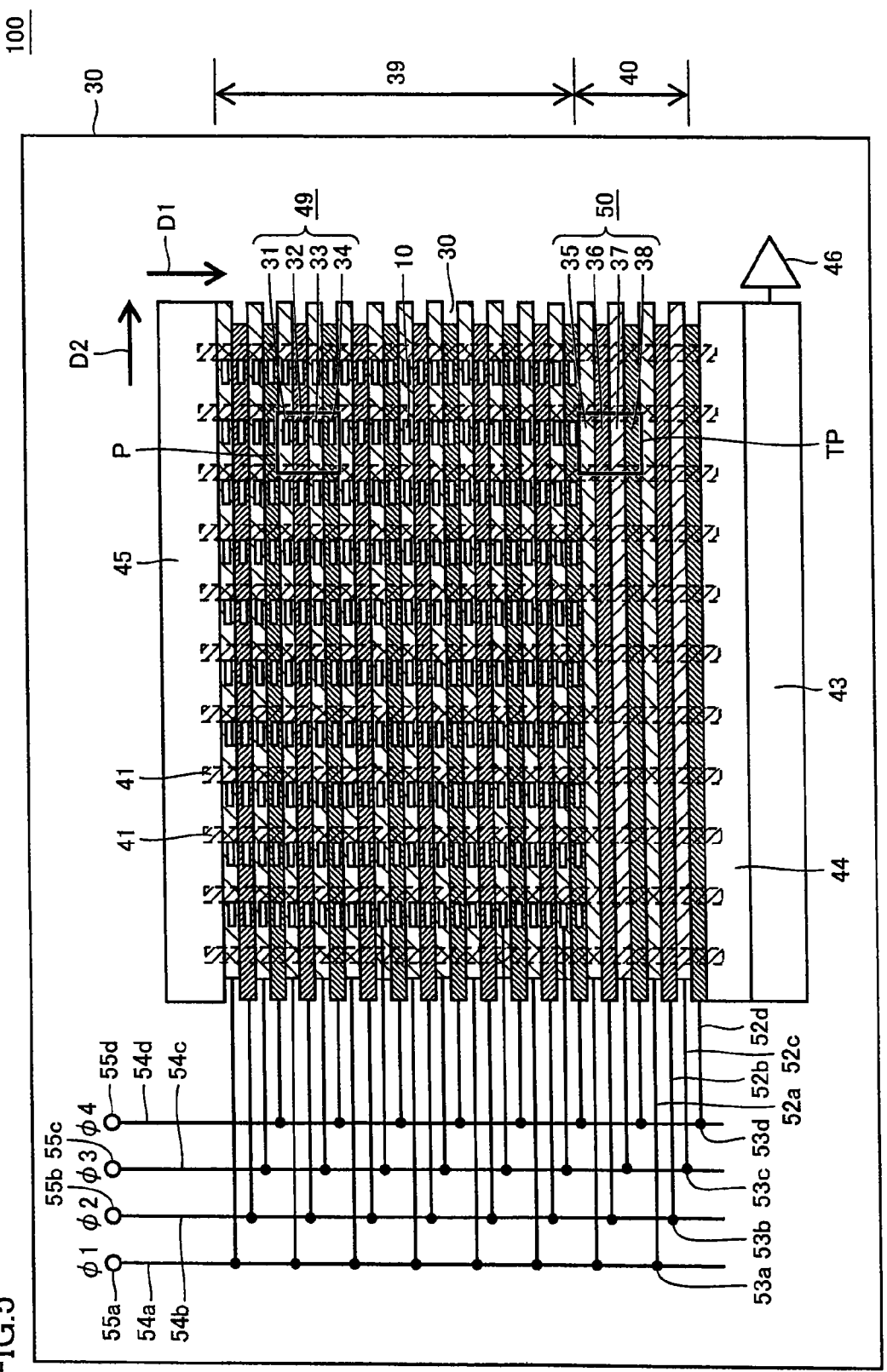
FIG. 5 is a plan view of an element in a TDI-type linear image sensor according to Embodiment 1 of the present invention.
Figure 6:
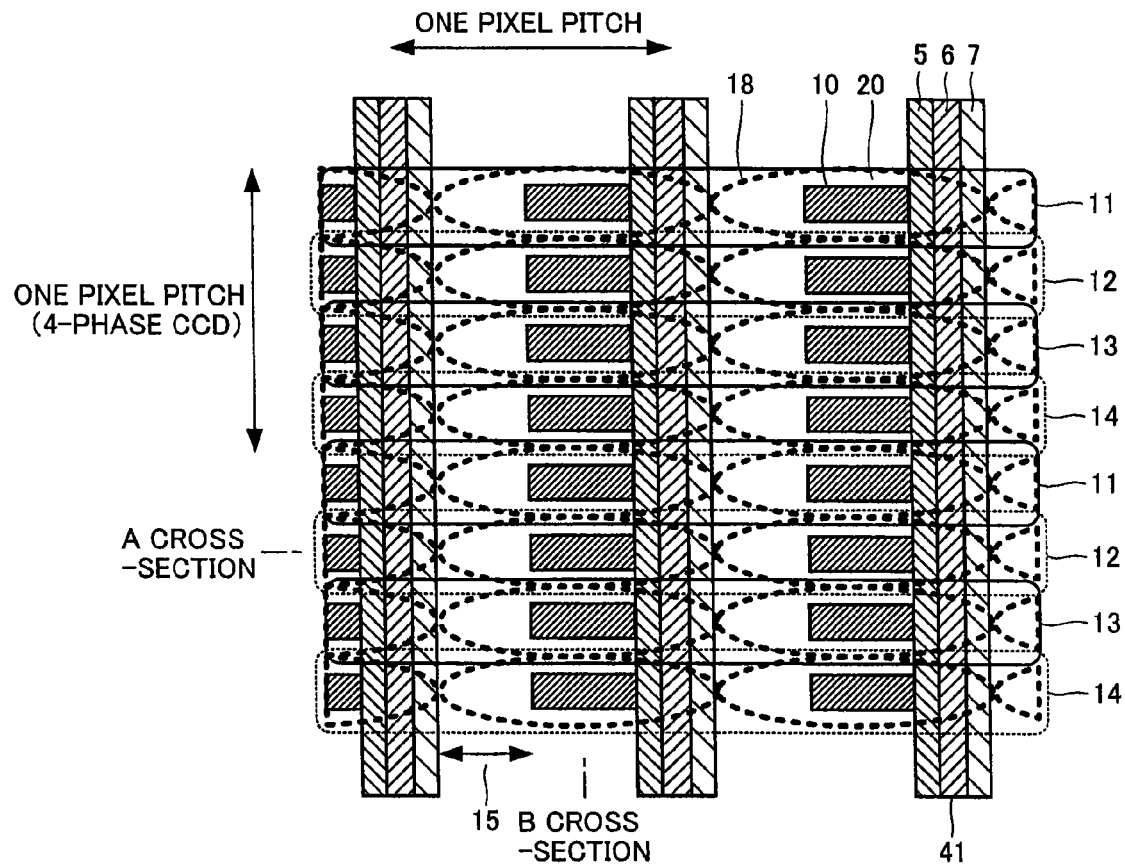
FIG. 6 is an enlarged plan view of the TDI-type linear image sensor according to Embodiment 1 of the present invention.
Figure 7:
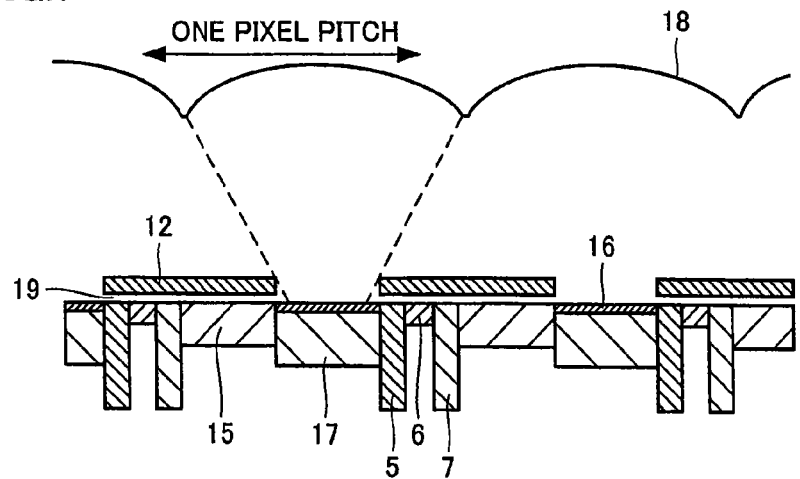
FIG. 7 is a diagram of a cross-sectional structure in an A cross-section of the TDI-type linear image sensor according to Embodiment 1 of the present invention.
Figure 8:
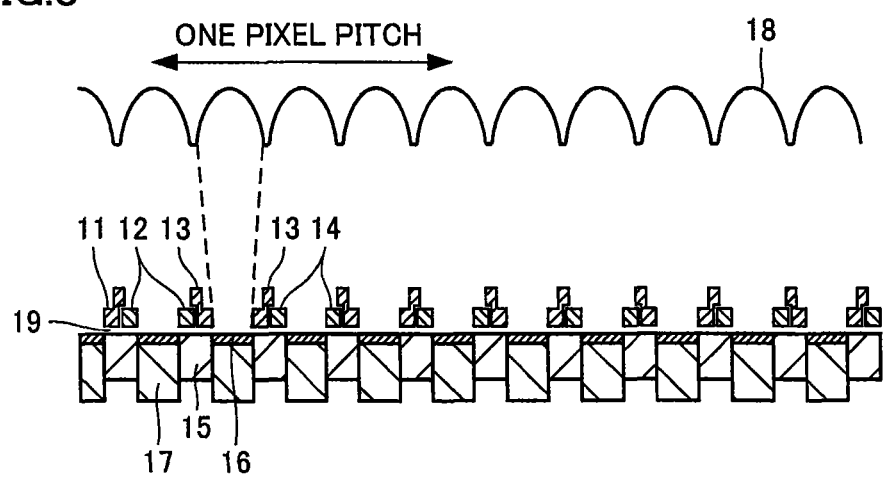
FIG. 8 is a diagram of a cross-sectional structure in a B cross-section of the TDI-type linear image sensor according to Embodiment 1 of the present invention.

FIG. 5 is a schematic plan view showing a circuit configuration of the TDI-type linear image sensor in Embodiment 1. FIG. 6 is an enlarged plan view of the TDI-type linear image sensor in Embodiment 1. FIG. 7 is a diagram of a cross-sectional structure in an A cross-section shown in FIG. 6, of the TDI-type linear image sensor in Embodiment 1. FIG. 8 is a diagram of a cross-sectional structure in a B cross-section shown in FIG. 6, of the TDI-type linear image sensor in Embodiment 1.

Referring to FIG. 5, in a TDI-type linear image sensor 100, pixels P and pixels for transfer TP are provided in rows and columns on a surface of a semiconductor substrate 30. Semiconductor substrate 30 is, for example, an Si (silicon) substrate.

A pixel region in which pixels P and pixels for transfer TP are arranged in rows and columns is divided into a light reception portion 39 and a transfer portion 40. Light reception portion 39 is a region where pixels P are arranged in rows and columns and a range shown with an arrow in FIG. 5 represents a range of light reception portion 39 in a vertical direction D1. Transfer portion 40 is a region where pixels for transfer TP are arranged in rows and columns, and a range shown with an arrow in FIG. 5 represents a range of transfer portion 40 in vertical direction D1. Light reception portion 39 and transfer portion 40 are provided on semiconductor substrate 30 adjacent to each other. FIG. 5 shows a portion corresponding to each of pixel P and pixel for transfer TP, for each pixel, in a quadrangle shown with a bold line. In the example shown in FIG. 5, pixels P of 6 vertical pixels×10 horizontal pixels are arranged in rows and columns in light reception portion 39, and pixels for transfer TP of 2 vertical pixels×10 horizontal pixels are arranged in rows and columns in transfer portion 40.

Pixel P is formed from photodetectors photoelectrically converting incident light and generating signal charges.

Pixel P has a transfer electrode 49 extending in a horizontal direction D2, in which four electrodes are juxtaposed in vertical direction D1. Transfer electrode 49 forms a vertical transfer gate transferring signal charges generated in pixel P to a charge accumulation portion 44. Transfer electrode 49 has a first TDI transfer gate electrode 31, a second TDI transfer gate electrode 32, a third TDI transfer gate electrode 33, and a fourth TDI transfer gate electrode 34. Thus, 4-phase drive can be achieved. Each of first TDI transfer gate electrode 31, second TDI transfer gate electrode 32, third TDI transfer gate electrode 33, and fourth TDI transfer gate electrode 34 has a gate non-opening portion forming a TDI transfer channel 15 shown in FIG. 6 and a gate-opening-portion-embedding photodiode 10.

Pixel for transfer TP has a transfer electrode 50 extending in horizontal direction D2, in which four electrodes are juxtaposed in vertical direction D1. Transfer electrode 50 forms a vertical transfer gate transferring signal charges generated in pixel P to charge accumulation portion 44. Transfer electrode 50 has a first transfer gate electrode 35, a second transfer gate electrode 36, a third transfer gate electrode 37, and a fourth transfer gate electrode 38. Though not shown, a light cut-off film is provided above pixel for transfer TP such that light from a subject is not incident.

Pixel for transfer TP is different from pixel P in not having gate-opening-portion-embedding photodiode 10.

First TDI transfer gate electrode 31, second TDI transfer gate electrode 32, third TDI transfer gate electrode 33, fourth TDI transfer gate electrode 34, first transfer gate electrode 35, second transfer gate electrode 36, third transfer gate electrode 37, and fourth transfer gate electrode 38 are formed, for example, of polysilicon (polycrystalline silicon) or the like. In the present embodiment, second TDI transfer gate electrode 32, fourth TDI transfer gate electrode 34, second transfer gate electrode 36, and fourth transfer gate electrode 38 are formed from a first polysilicon layer. In addition, first TDI transfer gate electrode 31, third TDI transfer gate electrode 33, first transfer gate electrode 35, and third transfer gate electrode 37 are formed from a second polysilicon layer.

Vertical transfer clocks for drive φ1, φ2, φ3, φ4 provided from input pins 55a, 55b, 55c, 55d are provided to pixels P and pixels for transfer TP through lines 52a, 52b, 52c, 52d, contacts 53a, 53b, 53c, 53d, and lines 54a, 54b, 54c, 54d. Here, lines, contacts, and input pins common in suffix a, b, c, d are connected.

Line 54a is electrically connected to first TDI transfer gate electrode 31 and first transfer gate electrode 35. Line 54b is electrically connected to second TDI transfer gate electrode 32 and second transfer gate electrode 36. Line 54c is electrically connected to third TDI transfer gate electrode 33 and third transfer gate electrode 37. Line 54d is electrically connected to fourth TDI transfer gate electrode 34 and fourth transfer gate electrode 38.

A pixel isolation region 41 is formed between pixel columns of pixels P and pixels for transfer TP provided in rows and columns. At an end on a side of transfer portion 40, of a pixel region including light reception portion 39 and transfer portion 40, a horizontal CCD 43 is provided, and charge accumulation portion 44 is provided between the pixel region and horizontal CCD 43. At an end opposite to horizontal CCD 43, a charge release portion 45 for releasing excessive charges is provided. An output amplifier 46 is connected to horizontal CCD 43.

A structure of pixel P will be described mainly with reference to FIG. 6. Pixel P is formed of 4-phase CCDs constituted of first TDI transfer gate 11, second TDI transfer gate 12, third TDI transfer gate 13, and fourth TDI transfer gate 14. First to fourth TDI transfer gates 11 to 14 each have a gate non-opening portion region directly under which TDI transfer channel 15 is formed and gate-opening-portion-embedding photodiode 10 within one pixel pitch.

In addition, pixel isolation region 41 is formed between gate-opening-embedding photodiode 10 and TDI transfer channel 15 of an adjacent pixel (gate non-opening portion). A lateral overflow drain is formed in pixel isolation region 41. As pixel isolation region 41, a charge release (overflow) drain 6 formed from a high-concentration impurity region of the second conductivity type, a channel stop 5 formed from a high-concentration impurity region of the first conductivity type, and an impurity region 7 of the first conductivity type are formed.

For all of four TDI transfer gate electrodes of the 4-phase CCDs constituting the pixels, a gate opening portion and a gate non-opening portion serving as TDI transfer channel 15 are formed. Embedding photodiode 10 is formed in the gate opening portion. Embedding photodiode 10 is constituted of a high-concentration impurity region 16 of the first conductivity type formed in the surface of the silicon substrate and an impurity region 17 of the second conductivity type formed in contact with high-concentration impurity region 16 of the first conductivity type in a deeper region of the silicon substrate.

Four microlenses 18 equal in number to the phases constituting the pixels of the CCDs are formed within one pixel pitch so as to gather light onto gate-opening-portion-embedding photodiode 10 of each phase. A radius of curvature of microlens 18 in a TDI transfer direction (vertical direction D1) is greater than a radius of curvature in a direction perpendicular to TDI transfer (horizontal direction D2). Therefore, sensitivity can be improved by gathering light onto the gate opening portion with the microlens, without causing lowering in MTF in the TDI transfer direction.

In addition, high-concentration impurity region 16 of the first conductivity type of gate-opening-portion-embedding photodiode 10 is in contact, at an arbitrary portion, with channel stop 5 formed from the high-concentration impurity region of the first conductivity type. Thus, lower noise can be realized.

Moreover, the gate opening portions of two adjacent pixels are not connected to each other at any portion.

In the description above, a P-type Si substrate, an N-type impurity region, a high-concentration P-type impurity region, and an N-type impurity region are applicable as semiconductor substrate 30, TDI transfer channel 15, high-concentration impurity region 16 of the first conductivity type, and impurity region 17 of the second conductivity type, respectively.

Microlens 18 may be fabricated independently of pixel P and may be bonded above pixel P.

Alternatively, microlens 18 may directly be formed on pixel P with the use of a semiconductor technique.

(Operation of Pixel)

Figure 9:
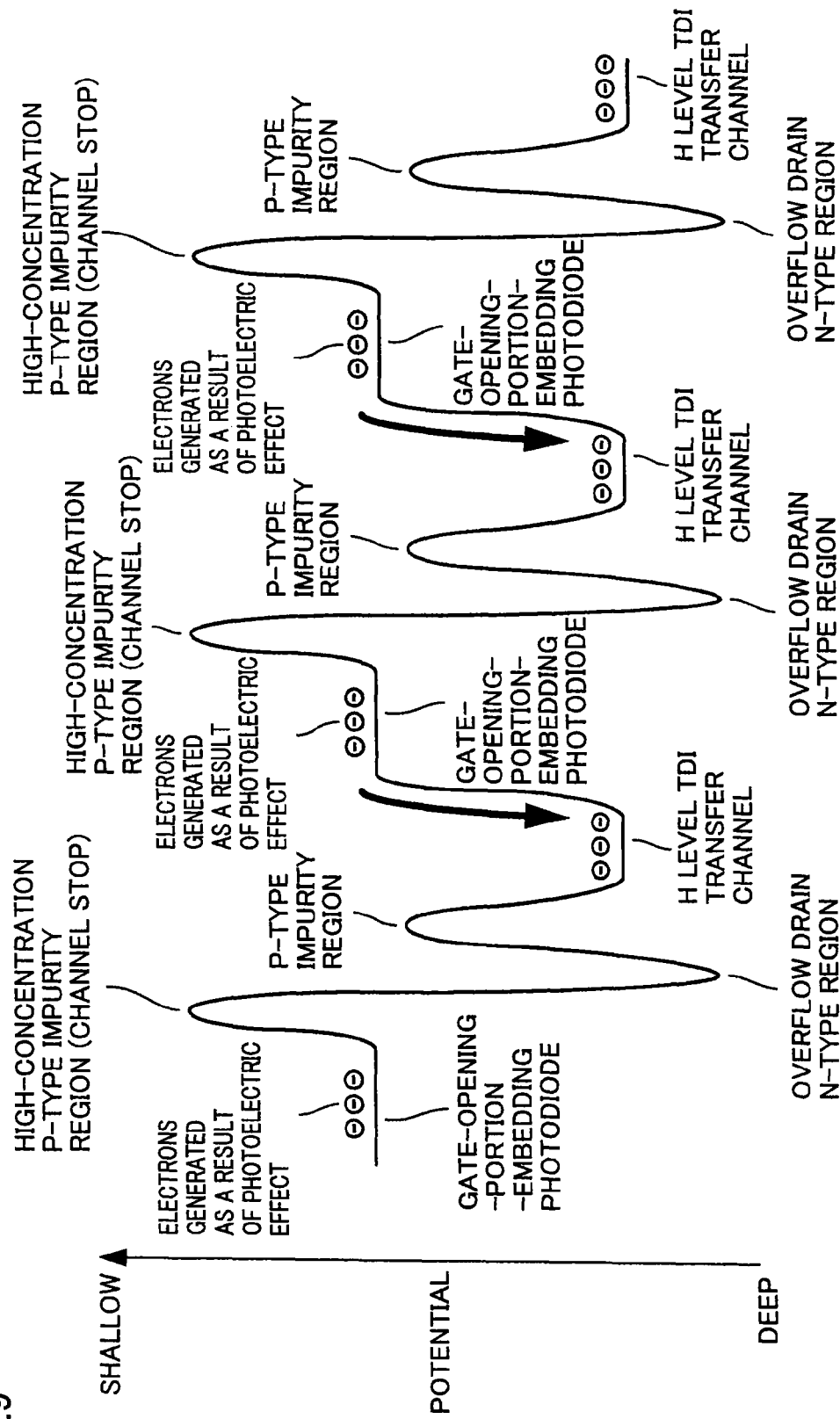
FIG. 9 is a diagram of a potential in the A cross-section of the TDI-type linear image sensor according to Embodiment 1 of the present invention.
Figure 10:
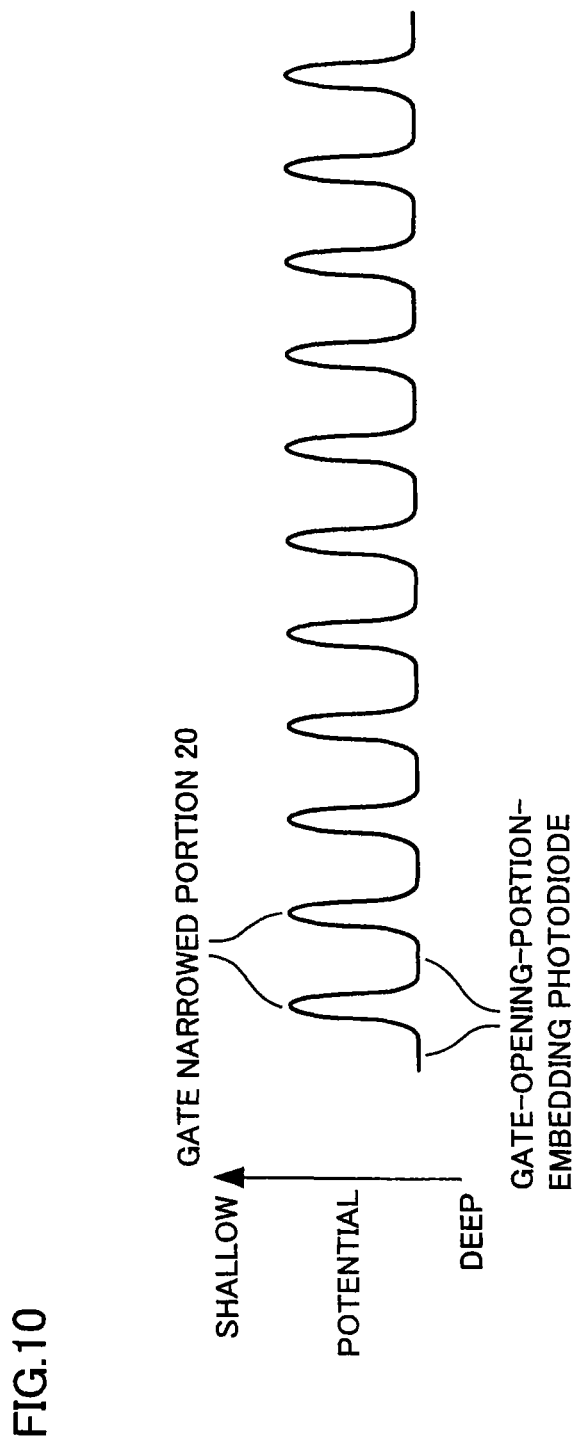
FIG. 10 is a diagram of a potential in the B cross-section of the TDI-type linear image sensor according to Embodiment 1 of the present invention.

FIG. 9 is a diagram of one-dimensional distribution in a cross-section, of a potential in the A cross-section shown in FIG. 6, of the TDI-type linear image sensor in Embodiment 1. FIG. 10 is a diagram of one-dimensional distribution in a cross-section, of a potential in the B cross-section shown in FIG. 6, of the TDI-type linear image sensor in Embodiment 1. Here, potential distribution diagrams in FIGS. 9 and 10 show a case that a P-type Si substrate and an N-type impurity region are applied as semiconductor substrate 30 and TDI transfer channel 15, respectively.

An operation of a pixel in the present embodiment will be described with reference to the diagrams of a potential of pixel P in FIGS. 9 and 10. Microlens 18 formed for each phase within one pixel gathers light incident on the pixel onto corresponding gate-opening-portion-embedding photodiode 10 for each phase. In gate-opening-portion-embedding photodiode 10, charges are generated as a result of photoelectric conversion.

Here, a potential of gate-opening-portion-embedding photodiode 10 is set to be shallower than a potential while TDI transfer channel 15 is at the High level (when a voltage of the High level is applied to the TDI transfer gate). On the other hand, a potential of gate-opening-portion-embedding photodiode 10 may be set to be shallower or deeper than a potential while TDI transfer channel 15 is at the Low level (when a Low voltage is applied to the TDI transfer gate).

Therefore, in horizontal direction D2, as shown in FIG. 9, charges generated in gate-opening-portion-embedding photodiode 10 flow into a potential well of the TDI transfer channel at the High level. As can be seen in the diagram of the potential in the diagram of one-dimensional distribution in the cross-section in vertical direction D1 in FIG. 10, a gate narrowed portion 20 adjacent to the gate opening portion is formed at an impurity concentration as high as in TDI transfer channel 15, however, a narrow channel effect takes place due to a narrow gate width and a potential is shallow. Therefore, charges generated in gate-opening-portion-embedding photodiode 10 do not flow to gate narrowed portion 20 but all of them flow into a potential well in the TDI transfer channel at the High level.

In the case that a potential while TDI transfer channel 15 is at the Low level is set to be shallower than a potential of gate-opening-portion-embedding photodiode 10, while corresponding TDI transfer channel 15 is at the Low level, gate-opening-portion-embedding photodiode 10 serves as a potential well, generated charges remain in this potential well, and they flow into the potential well of the MI transfer channel at the High level at the timing when corresponding TDI transfer channel 15 attains to the High level. Charges which flowed in the potential well of the TDI transfer channel at the High level are TDI-transferred within a TDI transfer channel directly under the gate non-opening portion through a transfer operation by the 4-phase drive CCDs.

In the case that a potential while TDI transfer channel 15 is at the Low level is set to be deeper than a potential of gate-opening-portion-embedding photodiode 10, charges generated in gate-opening-portion-embedding photodiode 10 flow into the TDI transfer channel at the Low level and TDI-transferred within the TDI transfer channel directly under the gate non-opening portion through a transfer operation by the 4-phase drive CCDs.

(Transfer Operation)

A transfer operation in TDI-type linear image sensor 100 will now be described. Referring again to FIG. 5, signal charges generated in the inside of pixel P as a result of photoelectric conversion of incident light are transferred in vertical direction D1 through a time delay and integration (TDI) operation. Signal charges subjected to time delay and integration (TDI) in light reception portion 39 are transferred through transfer portion 40 toward charge accumulation portion 44 in vertical direction D1. Signal charges once accumulated in charge accumulation portion 44 are transferred to horizontal CCD 43 for each horizontal period, and then transferred within horizontal CCD 43 in horizontal direction D2 and read from output amplifier 46.

(Flow of Charges in State 4)

Then, how light is incident and charges generated as a result of a photoelectric effect are accumulated in the present embodiment in state 4 at issue in the conventional technique among the four states of 4-phase drive will be described.

Figure 11:
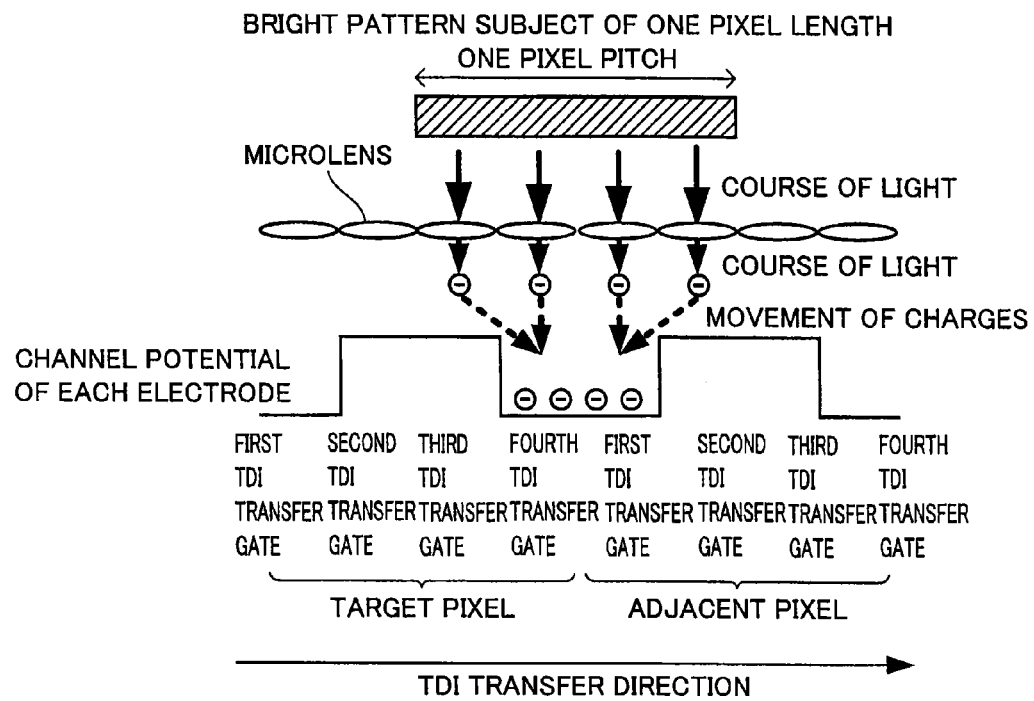
FIG. 11 is a schematic diagram illustrating a course of light and movement of charges in the TDI-type linear image sensor in the present invention.

FIG. 11 is a diagram representing a channel potential and a flow of charges in state 4 of 4-phase drive in the present embodiment.

Since a microlens is formed for each phase in the TDI-type linear image sensor, light incident above an electrode region of each phase is gathered onto a gate-opening-portion-embedding photodiode of each phase. Charges generated in the gate-opening-portion-embedding photodiode as a result of a photoelectric effect flow into a TDI transfer channel potential well of the gate non-opening portion of the same phase owing to a potential gradient. Therefore, it can be seen that charges generated by incident light are all gathered onto a CCD channel potential well directly under a subject, a problem of flow to an adjacent CCD channel potential well does not occur, and lowering in MTF in a TDI transfer direction does not take place.

(Effect)

As above, the present embodiment can solve the problem specific to a TDI-type linear image sensor, that is, lowering in MTF in a TDI transfer direction caused by gathering of light onto an electrode of one phase at the time when a microlens is mounted on a TDI-type linear image sensor, without impairing an effect of improvement in sensitivity by the microlens. Namely, according to the present embodiment, the microlens formed in each phase gathers incident light onto a gate-opening-portion-embedding photodiode, light absorption by a polysilicon layer which is a gate electrode is suppressed, significant improvement in sensitivity is realized, and at the same time, light incident above an electrode region of each phase is gathered onto a region of each phase. Therefore, lowering in MTF in a TDI transfer direction does not take place and a TDI-type linear image sensor of high performance can be provided.

(Variation)

Though a gate opening portion and a gate non-opening portion serving as TDI transfer channel 15 are formed in all of four TDI transfer gate electrodes of 4-phase CCDs constituting the pixels in the present embodiment, a gate opening portion may naturally be formed in some TDI transfer gate electrodes of the 4-phase CCDs constituting the pixels. In that case, as compared with the case that a gate opening portion is formed in all of the TDI transfer gate electrodes, though a degree of effectiveness in improvement of sensitivity is slightly lowered, such an effect as avoiding lowering in MTF in the TDI transfer direction and improving sensitivity can be maintained.

In addition, a cylindrical microlens not having a radius of curvature in the TDI transfer direction (vertical direction D1) may be employed. In this case as well, lowering in MTF in the TDI transfer direction can be avoided. Moreover, though a rate of improvement in sensitivity is slightly lowered, such an effect that light is gathered onto a gate opening portion owing to a curvature in a direction perpendicular to TDI transfer (horizontal direction D2) in the cylindrical microlens to thereby obtain improvement in sensitivity is achieved.

Figure 12:
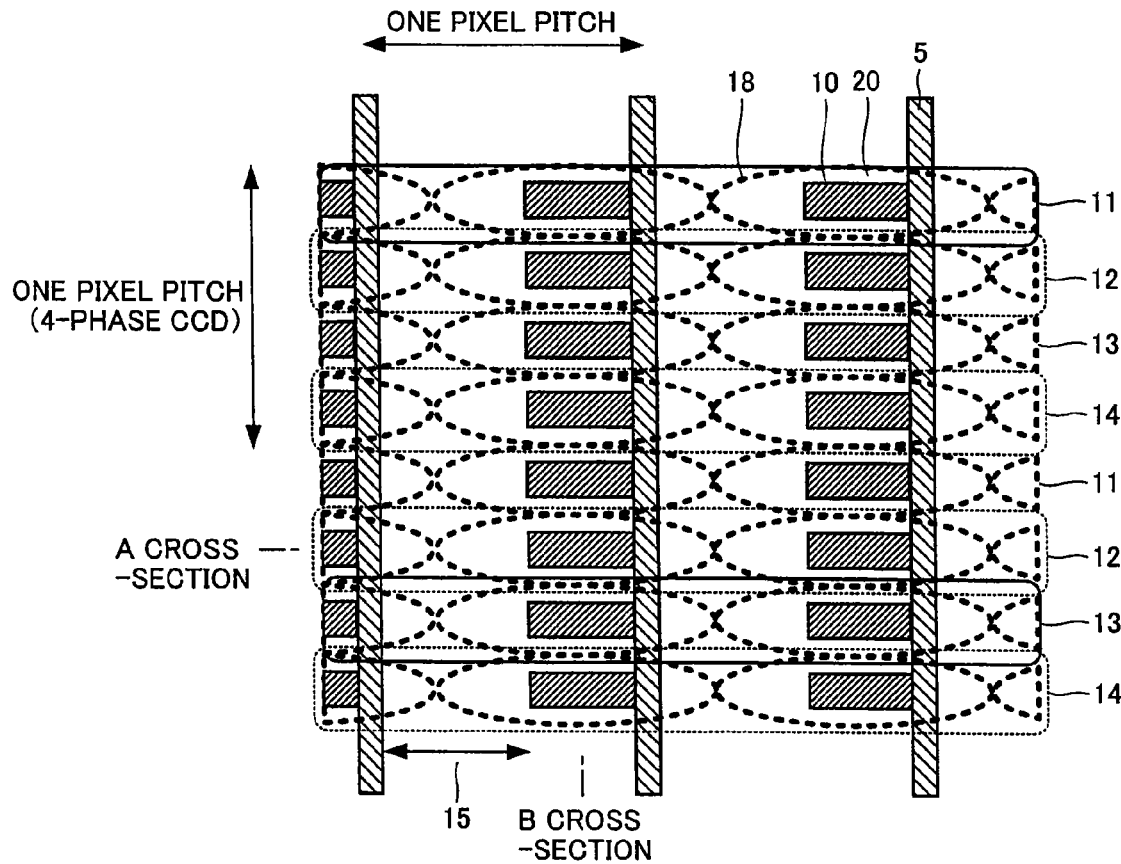
FIG. 12 is a plan view of an element in a TDI-type linear image sensor according to a variation of Embodiment 1 of the present invention.
Figure 13:
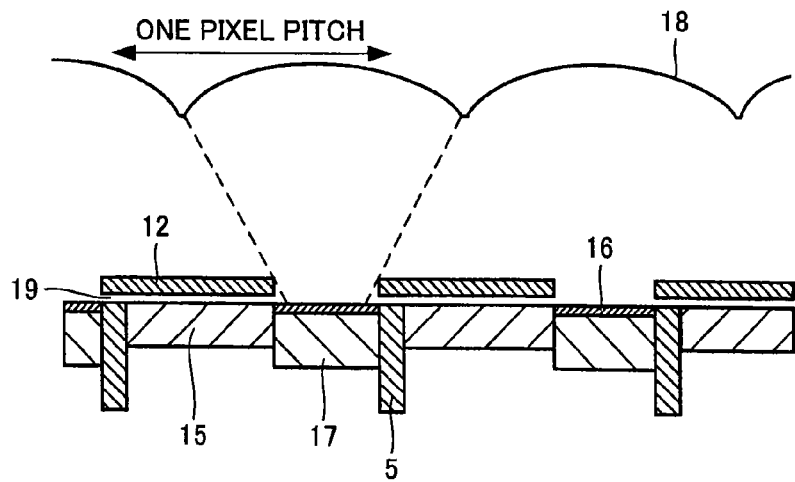
FIG. 13 is a diagram of a cross-sectional structure in an A cross-section of the TDI-type linear image sensor according to the variation of Embodiment 1 of the present invention.
Figure 14:
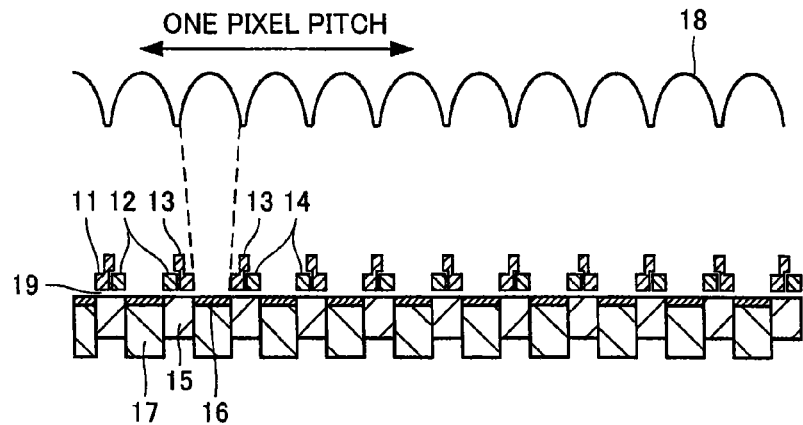
FIG. 14 is a diagram of a cross-sectional structure in a B cross-section of the TDI-type linear image sensor according to the variation of Embodiment 1 of the present invention.

Furthermore, such a configuration that no lateral overflow drain is formed in pixel isolation region 41 may be employed. FIG. 12 shows an enlarged plan view, FIG. 13 is a diagram of a cross-sectional structure in an A cross-section shown in FIG. 12, and FIG. 14 shows a diagram of a cross-sectional structure in a B cross-section shown in FIG. 12, of a configuration in which no lateral overflow drain is formed.

Though four microlenses 18 equal in number to the phases constituting the pixels of the CCDs are formed within one pixel pitch such that light is gathered onto gate-opening-portion-embedding photodiode 10 of each phase in the present embodiment, only one, two, or three microlens(es) 18 of four microlenses 18 may be formed such that light is gathered onto gate-opening-portion-embedding photodiode 10 of each phase.

Embodiment 2

A configuration of a TDI-type linear image sensor in Embodiment 2 of the present invention will be described with reference to FIGS. 15 to 18.

Figure 15:
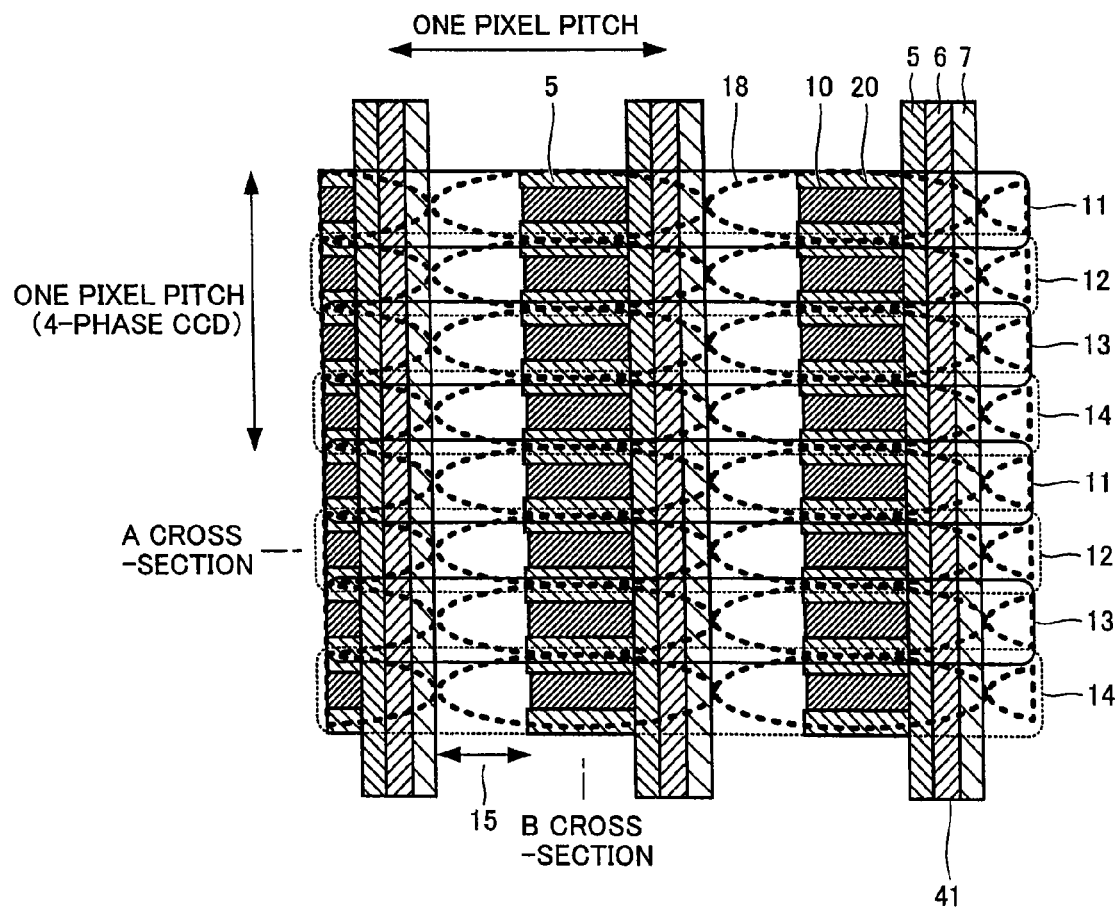
FIG. 15 is a plan view of an element in a TDI-type linear image sensor according to Embodiment 2 of the present invention.
Figure 16:
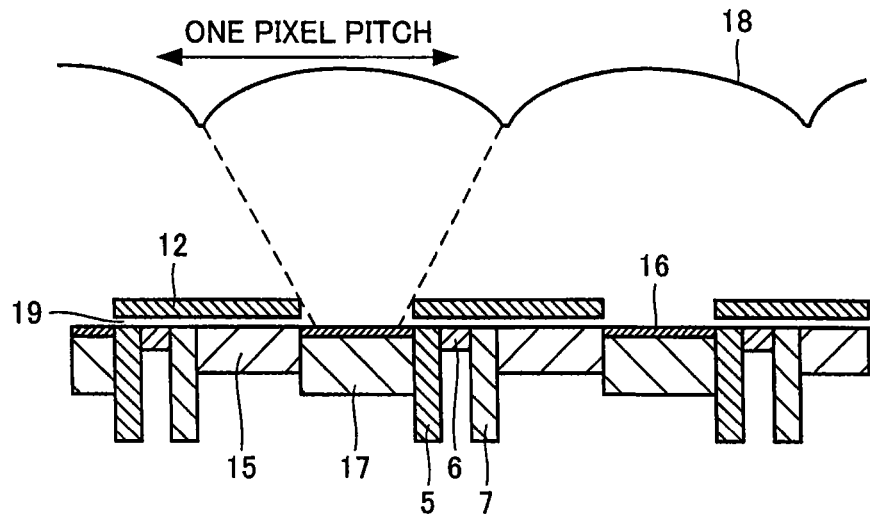
FIG. 16 is a diagram of a cross-sectional structure in an A cross-section of the TDI-type linear image sensor according to Embodiment 2 of the present invention.
Figure 17:
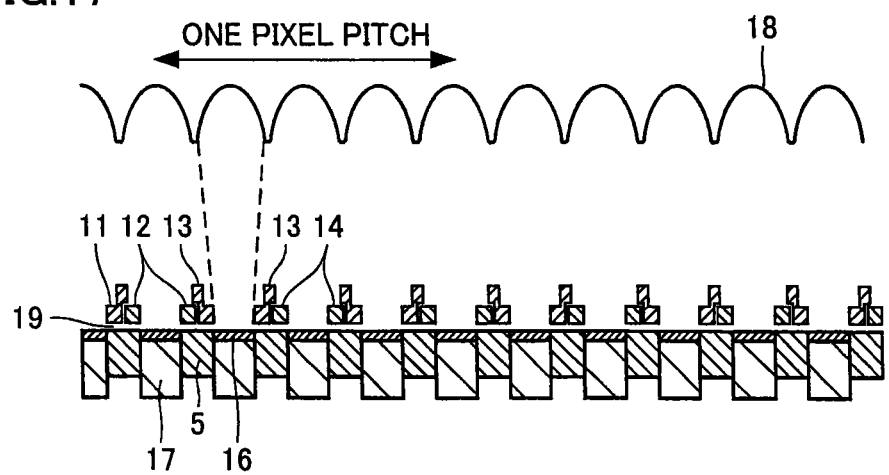
FIG. 17 is a diagram of a cross-sectional structure in a B cross-section of the TDI-type linear image sensor according to Embodiment 2 of the present invention.

FIG. 15 is an enlarged plan view of the TDI-type linear image sensor in Embodiment 2. FIG. 16 is a diagram of a cross-sectional structure in an A cross-section shown in FIG. 15, of the TDI-type linear image sensor in Embodiment 2. FIG. 17 is a diagram of a cross-sectional structure in a B cross-section shown in FIG. 15, of the TDI-type linear image sensor in Embodiment 2.

The TDI-type linear image sensor in Embodiment 2 is different from the TDI-type linear image sensor in Embodiment 1 in that channel stop 5 extends under gate narrowed portion 20 in Embodiment 2 as shown in FIGS. 15 and 17.

Namely, in the present embodiment, channel stop 5 formed from a high-concentration impurity region of the first conductivity type is formed between embedding photodiodes 10 formed within gate opening portions of two adjacent layers.

Figure 18:
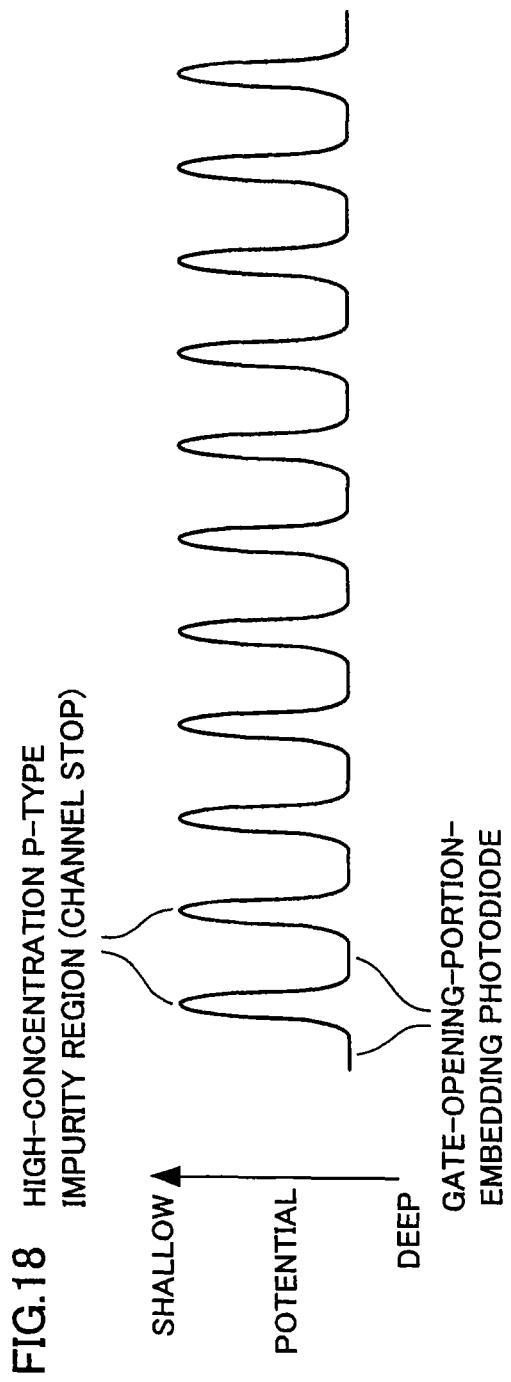
FIG. 18 is a diagram of a potential in the B cross-section of the TDI-type linear image sensor according to Embodiment 2 of the present invention.

FIG. 18 is a diagram of one-dimensional distribution in a cross-section, of a potential in the B cross-section shown in FIG. 15, of the TDI-type linear image sensor in Embodiment 2. Here, the potential distribution diagram in FIG. 18 shows a case that a P-type Si substrate and an N-type impurity region are applied as semiconductor substrate 30 and TDI transfer channel 15, respectively. In addition, in connection with the TDI-type linear image sensor in Embodiment 2, the diagram of one-dimensional distribution in the cross-section of a potential in the A cross-section shown in FIG. 15 is the same as FIG. 9 in Embodiment 1.

An operation of a pixel in the present embodiment will be described mainly with reference to the diagrams of a potential of pixel P in FIGS. 9 and 18.

Microlens 18 formed for each phase within one pixel gathers light incident on the pixel onto corresponding gate-opening-portion-embedding photodiode 10 for each phase. In gate-opening-portion-embedding photodiode 10, charges are generated as a result of photoelectric conversion.

Here, a potential of gate-opening-portion-embedding photodiode 10 is set to be shallower than a potential while TDI transfer channel 15 is at the High level (when a High voltage is applied to the TDI transfer gate). A potential of gate-opening-portion-embedding photodiode 10 may be set to be shallower or deeper than a potential while TDI transfer channel 15 is at the Low level (when a Low voltage is applied to the TDI transfer gate). Therefore, in horizontal direction D2, as shown in FIG. 9, charges generated in gate-opening-portion-embedding photodiode 10 flow into a potential well of the TDI transfer channel at the High level.

In the present embodiment, in the diagram of a potential in the diagram of one-dimensional distribution in the cross-section in vertical direction D1, as shown in FIG. 18, channel stop 5 is formed under gate narrowed portion 20 adjacent to the gate opening portion and a potential is shallow. Therefore, charges generated in gate-opening-portion-embedding photodiode 10 do not flow to gate narrowed portion 20 but all flow into a potential well of a High-level TDI transfer channel.

(Effect)

As above, according to the present embodiment, as in Embodiment 1, the microlens formed in each phase gathers incident light onto a gate-opening-portion-embedding photodiode, light absorption by a polysilicon layer which is a gate electrode is suppressed, and significant improvement in sensitivity is realized. In addition, at the same time, since light incident above an electrode region of each phase is gathered onto a region of each phase, lowering in MTF in a TDI transfer direction does not take place and a TDI-type linear image sensor of high performance can be provided.

Embodiment 3

Figure 19:
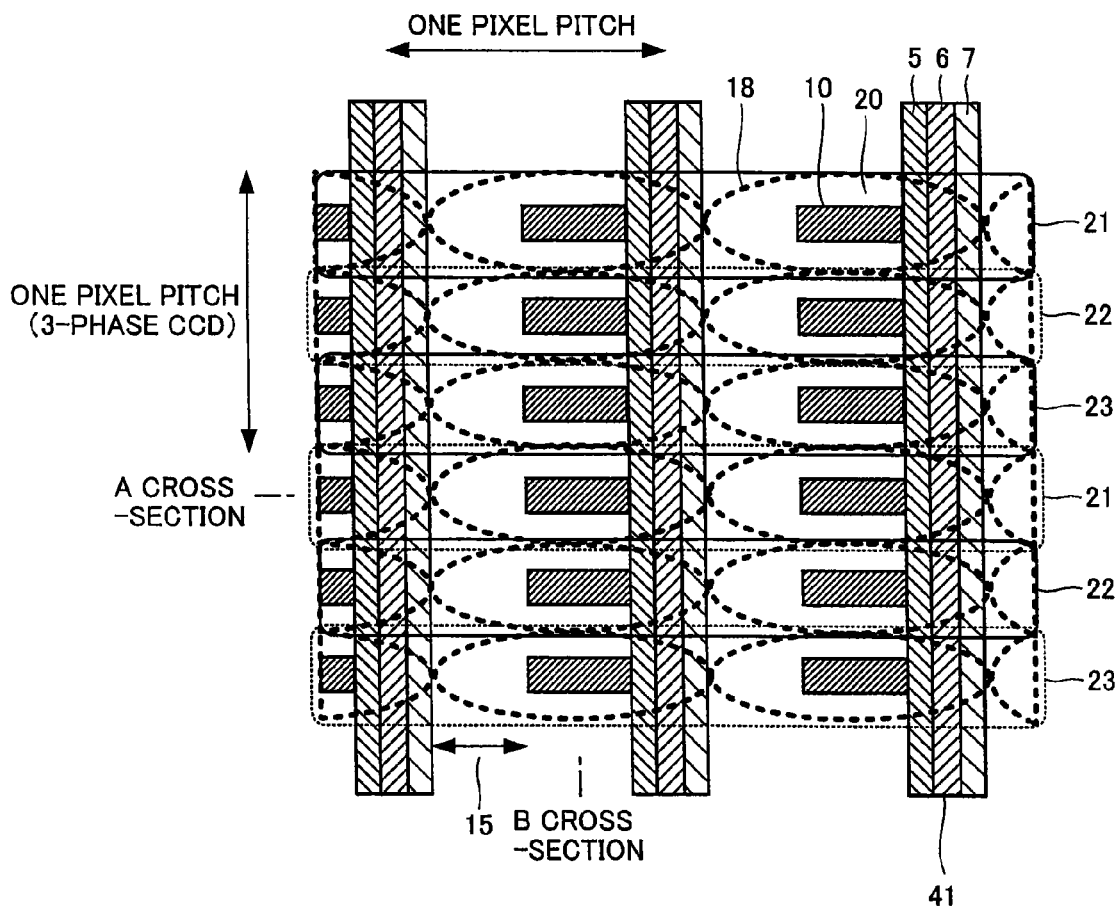
FIG. 19 is a plan view of an element in a TDI-type linear image sensor according to Embodiment 3 of the present invention.
Figure 20:
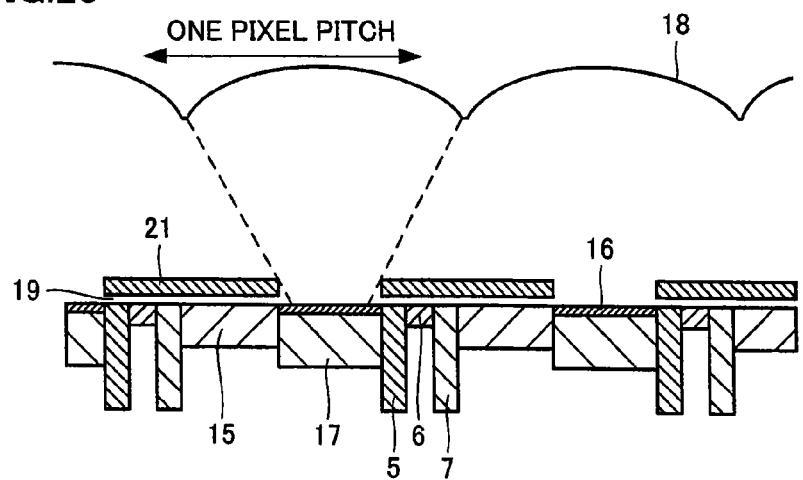
FIG. 20 is a diagram of a cross-sectional structure in an A cross-section of the TDI-type linear image sensor according to Embodiment 3 of the present invention.
Figure 21:
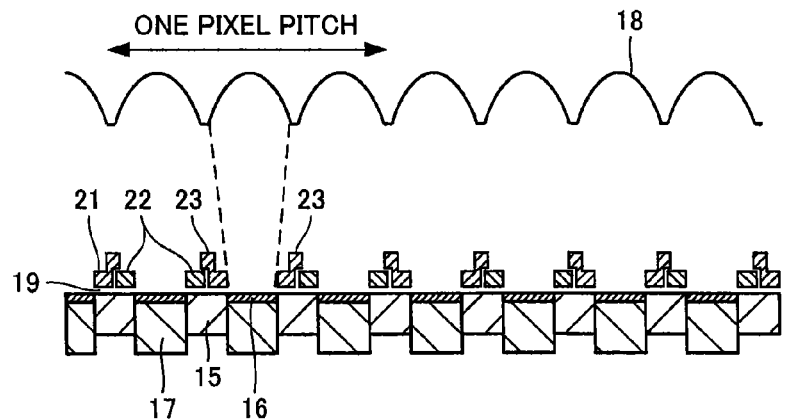
FIG. 21 is a diagram of a cross-sectional structure in a B cross-section of the TDI-type linear image sensor according to Embodiment 3 of the present invention.

A configuration of a TDI-type linear image sensor in Embodiment 3 of the present invention will be described with reference to FIGS. 19 to 21. FIG. 19 is an enlarged plan view of the TDI-type linear image sensor in Embodiment 3. FIG. 20 is a diagram of a cross-sectional structure in an A cross-section shown in FIG. 19, of the TDI-type linear image sensor in Embodiment 3. FIG. 21 is a diagram of a cross-sectional structure in a B cross-section shown in FIG. 19, of the TDI-type linear image sensor in Embodiment 3.

Difference from Embodiment 1 will mainly be described below.

A structure of pixel P will be described mainly with reference to FIG. 19.

Pixel P is formed of 3-phase CCDs constituted of a first TDI transfer gate 21, a second TDI transfer gate 22, and a third TDI transfer gate 23. Each of first to third TDI transfer gates 21 to 23 has a gate non-opening portion region directly under which TDI transfer channel 15 is formed and gate-opening-embedding photodiode 10 within one pixel pitch. In addition, pixel isolation region 41 is formed between gate-opening-embedding photodiode 10 and TDI transfer channel 15 of an adjacent pixel (gate non-opening portion), and a lateral overflow drain is formed in the pixel isolation region. As pixel isolation region 41, charge release drain 6 formed from a high-concentration impurity region of the second conductivity type, channel stop 5 formed from a high-concentration impurity region of the first conductivity type, and impurity region 7 of the first conductivity type are formed. In the description above, a P-type Si substrate, an N-type impurity region, a high-concentration N-type impurity region, a high-concentration P-type impurity region, and a P-type impurity region are applicable as semiconductor substrate 30, TDI transfer channel 15, charge release drain 6, channel stop 5, and impurity region 7 of the first conductivity type, respectively.

As described in the variation of Embodiment 1, such a configuration that no lateral overflow drain is formed in a pixel isolation region may naturally be employed.

For all of three TDI transfer gate electrodes of the 3-phase CCDs constituting the pixels, a gate opening portion and a gate non-opening portion serving as TDI transfer channel 15 are formed. In the gate opening portion, high-concentration impurity region 16 of the first conductivity type is formed in the surface of the silicon substrate, impurity region 17 of the second conductivity type formed in contact with high-concentration impurity region 16 of the first conductivity type in a deeper region of the silicon substrate is provided, and embedding photodiode 10 is thus formed. Then, each of three microlenses 18 equal in number to the phases constituting the pixels of the CCDs is formed within one pixel pitch so as to gather light onto gate-opening-portion-embedding photodiode 10 of each phase. A radius of curvature of microlens 18 in a TDI transfer direction (vertical direction D1) is greater than a radius of curvature in a direction perpendicular to TDI transfer (horizontal direction D2).

High-concentration impurity region 16 of the first conductivity type of gate-opening-portion-embedding photodiode 10 is in contact, at an arbitrary portion, with channel stop 5 formed from the high-concentration impurity region of the first conductivity type.

In the description above, a P-type Si substrate, an N-type impurity region, a high-concentration P-type impurity region, and an N-type impurity region are applicable as semiconductor substrate 30, TDI transfer channel 15, high-concentration impurity region 16, and impurity region 17, respectively.

Microlens 18 may be fabricated independently of pixel P and may be bonded above pixel P.

Alternatively, microlens 18 may directly be formed on pixel P with the use of a semiconductor technique.

Since the diagram of a potential of pixel P in the present embodiment is the same as in Embodiment 1, an operation of a pixel in the present embodiment will be described with reference to FIGS. 9 and 10.

Referring to FIG. 9, microlens 18 formed for each phase within one pixel gathers light incident on the pixel onto corresponding gate-opening-portion-embedding photodiode 10 for each phase. Charges are generated by photoelectric conversion in gate-opening-portion-embedding photodiode 10.

Here, a potential of gate-opening-portion-embedding photodiode 10 is set to be shallower than a potential while TDI transfer channel 15 is at the High level (when a High voltage is applied to the TDI transfer gate). A potential of gate-opening-portion-embedding photodiode 10 may be set to be shallower or deeper than a potential while TDI transfer channel 15 is at the Low level (when a Low voltage is applied to the TDI transfer gate). Therefore, charges generated in gate-opening-portion-embedding photodiode 10 flow into a potential well of the High-level TDI transfer channel.

Referring to FIG. 10, gate narrowed portion 20 adjacent to the gate opening portion is formed at an impurity concentration as high as in TDI transfer channel 15, however, a narrow channel effect takes place due to a narrow gate width and a potential is shallow. Therefore, charges generated in gate-opening-portion-embedding photodiode 10 do not flow to gate narrowed portion 20 but all of them flow into a potential well in the High-level TDI transfer channel. It is noted that, as in Embodiment 2, channel stop 5 may extend under gate narrowed portion 20. In this case as well, under gate narrowed portion 20, a potential is shallow owing to channel stop 5, and thus charges generated in gate-opening-portion-embedding photodiode 10 do not flow to gate narrowed portion 20 but all flow to a potential well of the High-level TDI transfer channel.

In the case that a Low-level potential of TDI transfer channel 15 is set to be shallower than a potential of gate-opening-portion-embedding photodiode 10, while corresponding TDI transfer channel 15 is at the Low level, gate-opening-portion-embedding photodiode 10 serves as a potential well, generated charges remain in this potential well, and they flow into the potential well of the High-level TDI transfer channel at the timing when corresponding TDI transfer channel 15 attains to the High level. Charges which flowed in the potential well of the High-level TDI transfer channel are TDI-transferred within a TDI transfer channel directly under the gate non-opening portion through a transfer operation by the 3-phase drive CCDs.

In the case that a Low-level potential of TDI transfer channel 15 is set to be deeper than a potential of gate-opening-portion-embedding photodiode 10, charges generated in gate-opening-portion-embedding photodiode 10 flow into a Low-level TDI transfer channel and TDI-transferred within the TDI transfer channel directly under the gate non-opening portion through a transfer operation by the 3-phase drive CCDs.

(Effect)

According to the present embodiment, the microlens formed in each phase gathers incident light onto a gate-opening-portion-embedding photodiode, light absorption by a polysilicon layer which is a gate electrode is suppressed, and significant improvement in sensitivity is realized. In addition, at the same time, since light incident above an electrode region of each phase is gathered onto a region of each phase, as in the case of the 4-phase CCDs in Embodiment 1, lowering in MTF in a TDI transfer direction does not take place and a TDI-type linear image sensor of high performance can be provided.

(Variation)

Though a gate opening portion and a gate non-opening portion serving as TDI transfer channel 15 are formed in all of three TDI transfer gate electrodes of the 3-phase CCDs constituting the pixels in the present embodiment, a gate opening portion may naturally be formed in some TDI transfer gate electrodes of the 3-phase CCDs constituting the pixels. In that case, as compared with the case that a gate opening portion is formed in all of the TDI transfer gate electrodes, though a degree of effectiveness in improvement of sensitivity is slightly lowered, such an effect as avoiding lowering in MTF in the TDI transfer direction and improving sensitivity is achieved.

Embodiment 4

Figure 22:
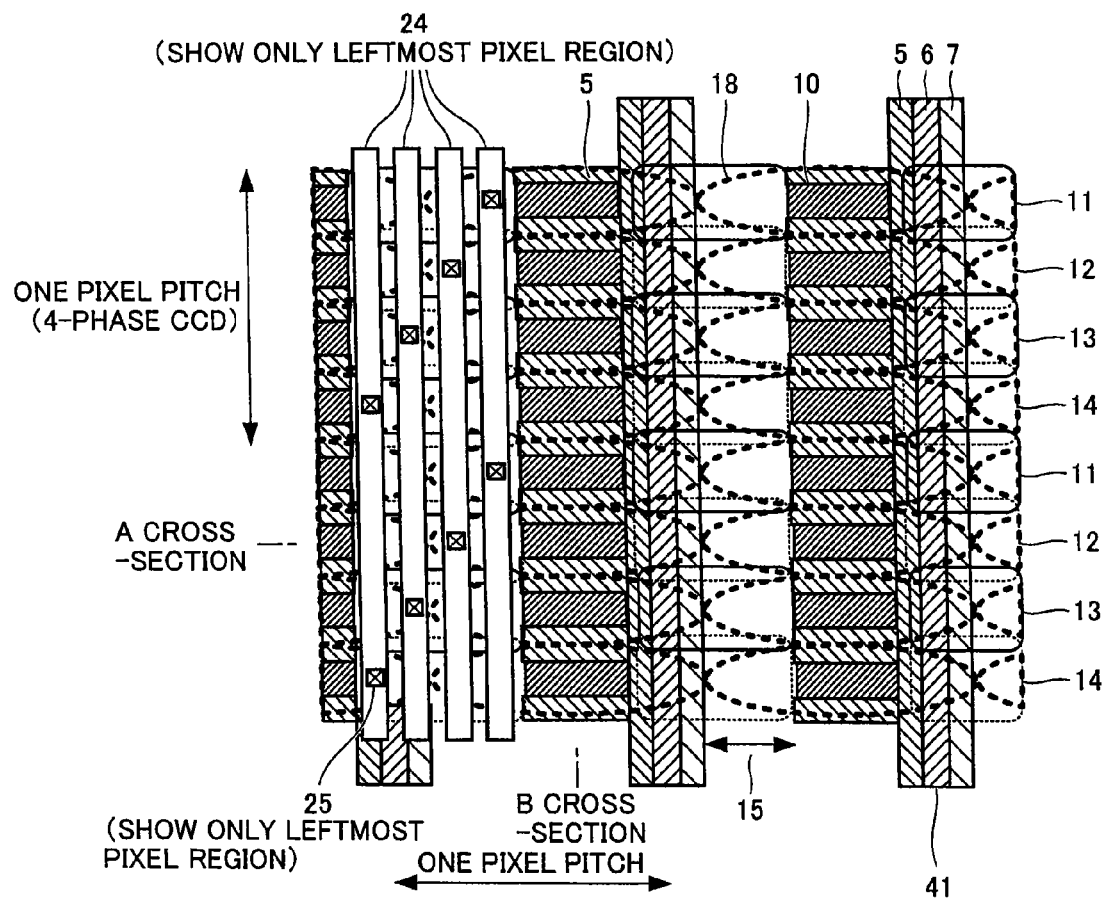
FIG. 22 is a plan view of an element in a TDI-type linear image sensor according to Embodiment 4 of the present invention.
Figure 23:
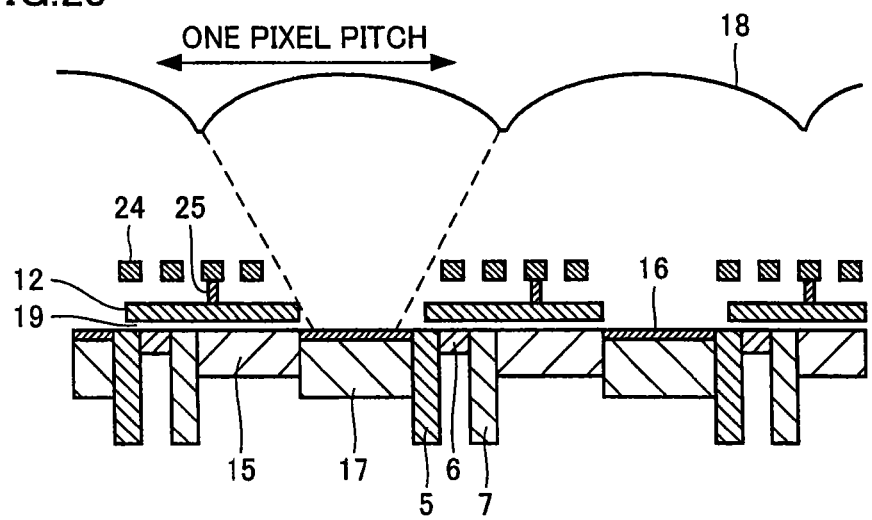
FIG. 23 is a diagram of a cross-sectional structure in an A cross-section of the TDI-type linear image sensor according to Embodiment 4 of the present invention.
Figure 24:
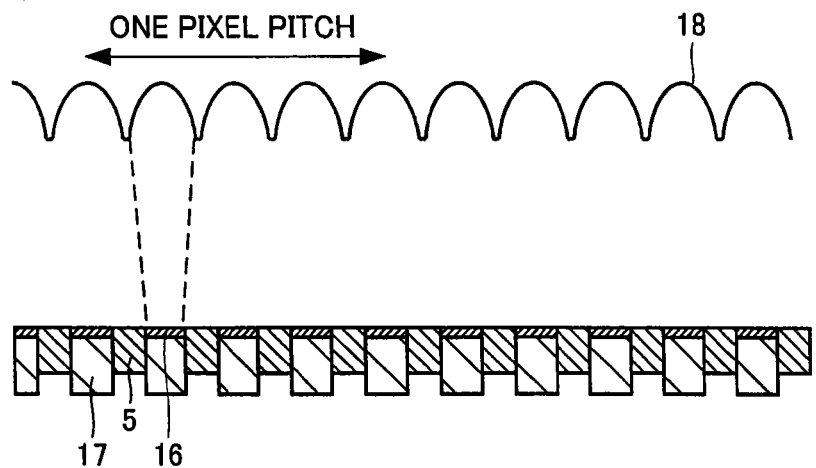
FIG. 24 is a diagram of a cross-sectional structure in a B cross-section of the TDI-type linear image sensor according to Embodiment 4 of the present invention.

A configuration of a TDI-type linear image sensor in Embodiment 4 of the present invention will be described with reference to FIGS. 22 to 24. FIG. 22 is an enlarged plan view of the TDI-type linear image sensor in Embodiment 4. FIG. 23 is a diagram of a cross-sectional structure in an A cross-section shown in FIG. 22, of the TDI-type linear image sensor in Embodiment 4. FIG. 24 is a diagram of a cross-sectional structure in a B cross-section shown in FIG. 22, of the TDI-type linear image sensor in Embodiment 4.

The TDI-type linear image sensor in Embodiment 4 is different from the TDI-type linear image sensor in Embodiment 1 in that each TDI transfer gate in pixel P is completely disconnected from each TDI transfer gate in an adjacent pixel in Embodiment 4 and it is not connected by gate narrowed portion 20 as in Embodiments 1 to 3.

Similarly to Embodiment 2 in which channel stop 5 is formed directly under gate narrowed portion 20, in the present embodiment, though gate narrowed portion 20 is removed, channel stop 5 formed directly under gate narrowed portion 20 in Embodiment 2 is formed also in the present embodiment, without being removed.

Since each TDI transfer gate in pixel P is completely disconnected from each TDI transfer gate in an adjacent pixel, an aluminum interconnection 24 and a gate contact 25 are formed for each pixel pitch and an application voltage is supplied to the first to fourth TDI transfer gates. Since microlens 18 gathers light, unless an aluminum interconnection is formed directly above a region of gate-opening-portion-embedding photodiode 10, lowering in sensitivity due to block of incident light by the aluminum interconnection does not occur even though aluminum interconnection 24 is formed directly above TDI transfer channel 15 as in the present embodiment.

In connection with the TDI-type linear image sensor in Embodiment 4, the diagram of one-dimensional distribution in the cross-section of a potential in the A cross-section shown in FIG. 22 is the same as FIG. 9 in Embodiment 1, and the diagram of one-dimensional distribution in the cross-section of a potential in the B cross-section shown in FIG. 22 is the same as FIG. 18 in Embodiment 2. Therefore, an operation of a pixel in the present embodiment will be described with reference to FIGS. 9 and 18.

An operation of a pixel in the present embodiment will be described mainly with reference to the diagrams of a potential of pixel P in FIGS. 9 and 18.

Microlens 18 formed for each phase within one pixel gathers light incident on the pixel onto corresponding gate-opening-portion-embedding photodiode 10 for each phase. In gate-opening-portion-embedding photodiode 10, charges are generated as a result of photoelectric conversion.

Here, a potential of gate-opening-portion-embedding photodiode 10 is set to be shallower than a potential while TDI transfer channel 15 is at the High level (when a High voltage is applied to the TDI transfer gate). A potential of gate-opening-portion-embedding photodiode 10 may be set to be shallower or deeper than a potential while TDI transfer channel 15 is at the Low level (when a Low voltage is applied to the TDI transfer gate). Therefore, in horizontal direction D2, as shown in FIG. 9, charges generated in gate-opening-portion-embedding photodiode 10 flow into a potential well of the TDI transfer channel at the High level.

In the present embodiment, in vertical direction D1, as shown in FIG. 18, charges generated in gate-opening-portion-embedding photodiode 10 do not flow in vertical direction D1 (a potential is shallow owing to channel stop 5) but all flow into a potential well of the High-level TDI transfer channel.

(Effect)

As above, in the present embodiment, as in Embodiment 1, the microlens formed in each phase gathers incident light onto a gate-opening-portion-embedding photodiode, light absorption by a polysilicon layer which is a gate electrode is suppressed, and significant improvement in sensitivity is realized. In addition, at the same time, since light incident above an electrode region of each phase is gathered onto a region of each phase, lowering in MTF in a TDI transfer direction does not take place, and a TDI-type linear image sensor of high performance can be provided.

Embodiment 5

Figure 25:
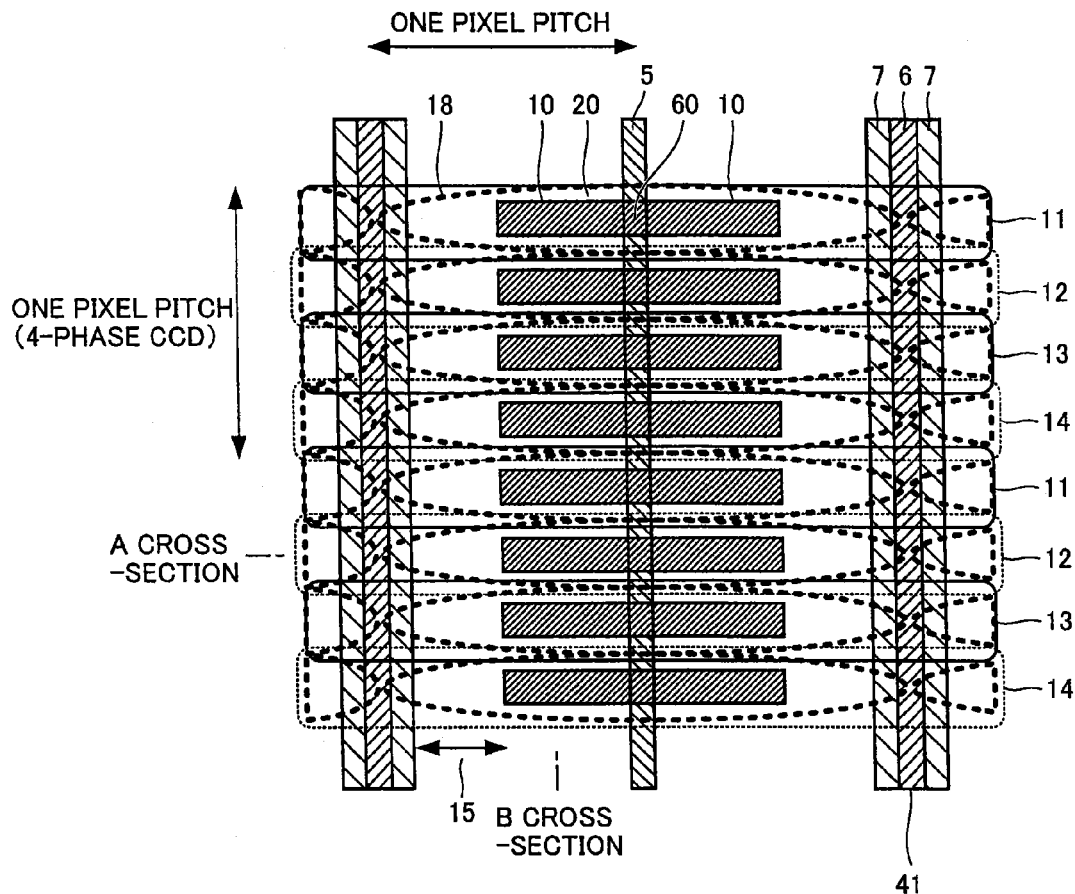
FIG. 25 is a plan view of an element in a TDI-type linear image sensor according to Embodiment 5 of the present invention.
Figure 26:
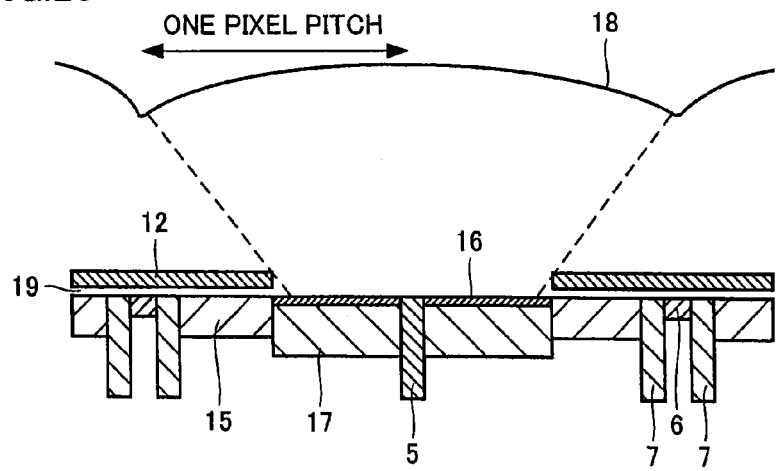
FIG. 26 is a diagram of a cross-sectional structure in an A cross-section of the TDI-type linear image sensor according to Embodiment 5 of the present invention.
Figure 27:
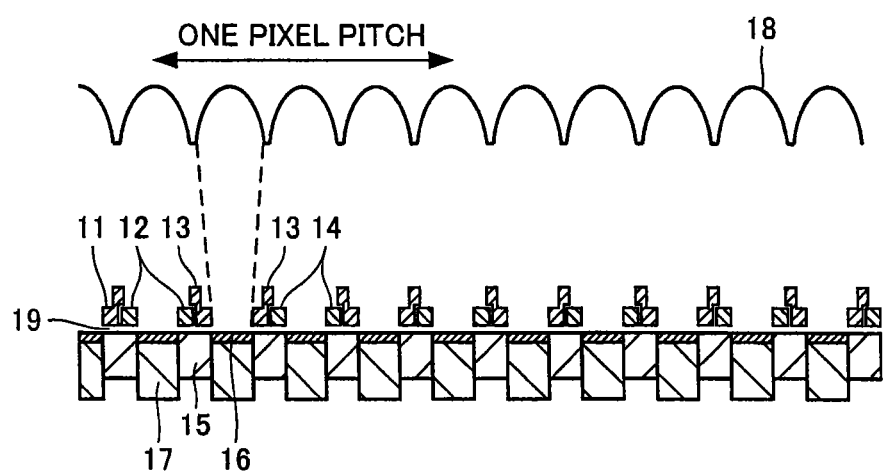
FIG. 27 is a diagram of a cross-sectional structure in a B cross-section of the TDI-type linear image sensor according to Embodiment 5 of the present invention.

A configuration of a TDI-type linear image sensor in Embodiment 5 of the present invention will be described with reference to FIGS. 25 to 27. FIG. 25 is an enlarged plan view of the TDI-type linear image sensor according to Embodiment 5. FIG. 26 is a diagram of a cross-sectional structure in an A cross-section shown in FIG. 25, of the TDI-type linear image sensor in Embodiment 5. FIG. 27 is a diagram of a cross-sectional structure in a B cross-section shown in FIG. 25, of the TDI-type linear image sensor in Embodiment 5.

A structure of pixel P will be described mainly with reference to FIG. 25.

Pixel P is constituted of 4-phase CCDs constituted of first TDI transfer gate 11, second TDI transfer gate 12, third TDI transfer gate 13, and fourth TDI transfer gate 14, and first to fourth TDI transfer gates 11 to 14 each have a gate non-opening portion region directly under which TDI transfer channel 15 is formed and gate-opening-embedding photodiode 10 within one pixel pitch.

Gate-opening-embedding photodiode 10 is connected to gate-opening-embedding photodiode 10 in an adjacent pixel through a gate opening channel stop 60 formed from a high-concentration impurity region of the first conductivity type. Gate opening channel stop 60 is a region of which gate directly above is open in channel stop 5. Therefore, gate-opening-embedding photodiode 10 and gate-opening-embedding photodiode 10 in the adjacent pixel are isolated from each other by gate opening channel stop 60.

On the other hand, TDI transfer channel 15 (gate non-opening portion) is isolated from TDI transfer channel 15 (gate non-opening portion) of the adjacent pixel by a pair of impurity regions 7 of the first conductivity type and charge release drain 6 formed from the high-concentration impurity region of the second conductivity type formed to lie therebetween.

In the description above, a P-type Si substrate, an N-type impurity region, a high-concentration N-type impurity region, a high-concentration P-type impurity region, and a P-type impurity region are applicable as semiconductor substrate 30, TDI transfer channel 15, charge release drain 6, channel stop 5, and impurity region 7 of the first conductivity type, respectively.

In gate-opening-embedding photodiode 10, high-concentration impurity region 16 of the first conductivity type is formed in the surface of the silicon substrate, impurity region 17 of the second conductivity type is provided in contact with high-concentration impurity region 16 of the first conductivity type in a deeper region of the silicon substrate, and an embedding photodiode is thus formed.

In a pair of two pixels adjacent to each other with channel stop 5 lying therebetween, four microlenses 18 equal in number to the phases constituting the pixels of the CCDs are formed such that light is gathered onto a region which is combination of gate-opening-portion-embedding photodiode 10, gate opening channel stop 60, and adjacent gate-opening-portion-embedding photodiode 10. A radius of curvature of that microlens 18 in a TDI transfer direction (vertical direction D1) is greater than a radius of curvature in a direction perpendicular to TDI transfer (horizontal direction D2). High-concentration impurity region 16 of the first conductivity type of gate-opening-portion-embedding photodiode 10 is in contact, at an arbitrary portion, with channel stop 5.

In the description above, a P-type Si substrate, an N-type impurity region, a high-concentration P-type impurity region, and an N-type impurity region are applicable as semiconductor substrate 30, TDI transfer channel 15, high-concentration impurity region 16, and impurity region 17, respectively.

Microlens 18 may be fabricated independently of pixel P and may be bonded above pixel P.

Alternatively, microlens 18 may directly be formed on pixel P with the use of a semiconductor technique.

(Effect)

As above, in the present embodiment, as in Embodiment 1, the microlens formed in each phase gathers incident light onto a gate-opening-portion-embedding photodiode, light absorption by a polysilicon layer which is a gate electrode is suppressed, and significant improvement in sensitivity is realized. In addition, at the same time, since light incident above an electrode region of each phase is gathered onto a region of each phase, lowering in MTF in a TDI transfer direction does not take place and a TDI-type linear image sensor of high performance can be provided.

Embodiment 6

A configuration of a TDI-type linear image sensor in Embodiment 6 of the present invention will be described with reference to FIGS. 28 to 31.

Figure 28:
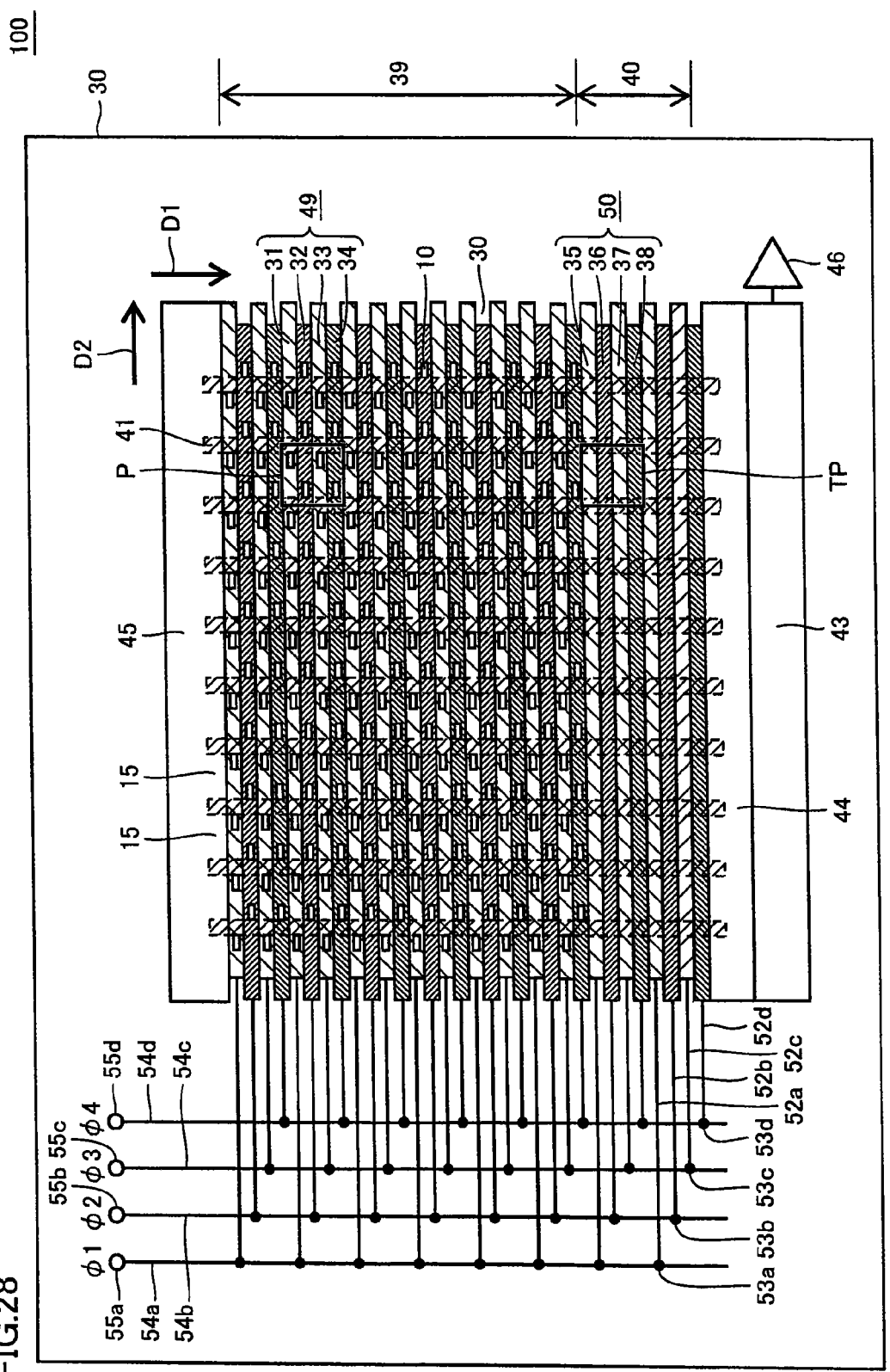
FIG. 28 is a plan view of an element in a TDI-type linear image sensor according to Embodiment 6 of the present invention.
Figure 29:
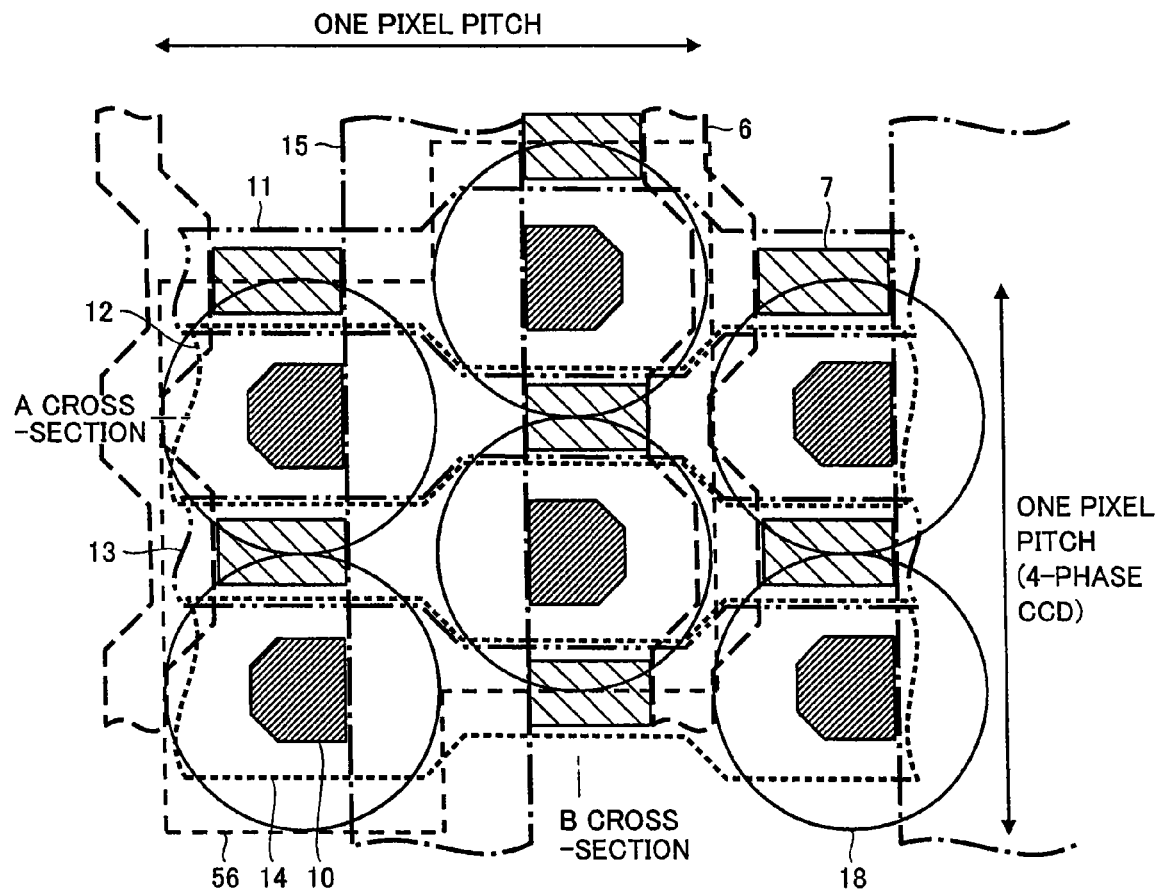
FIG. 29 is an enlarged view of the element in the TDI-type linear image sensor according to Embodiment 6 of the present invention.
Figure 30:
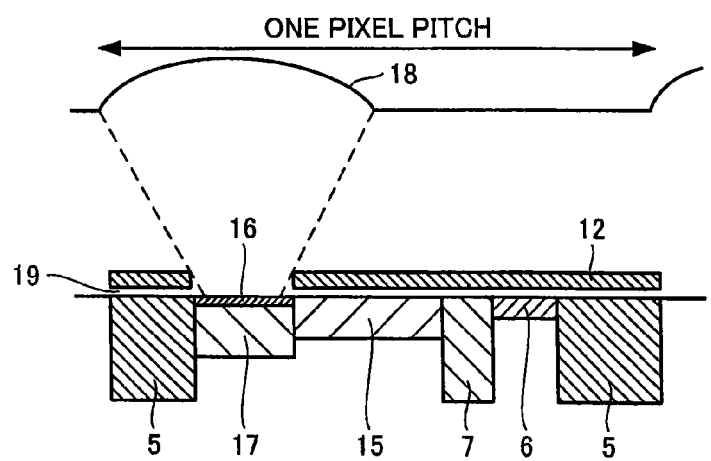
FIG. 30 is a diagram of a cross-sectional structure in an A cross-section of the TDI-type linear image sensor according to Embodiment 6 of the present invention.
Figure 31:
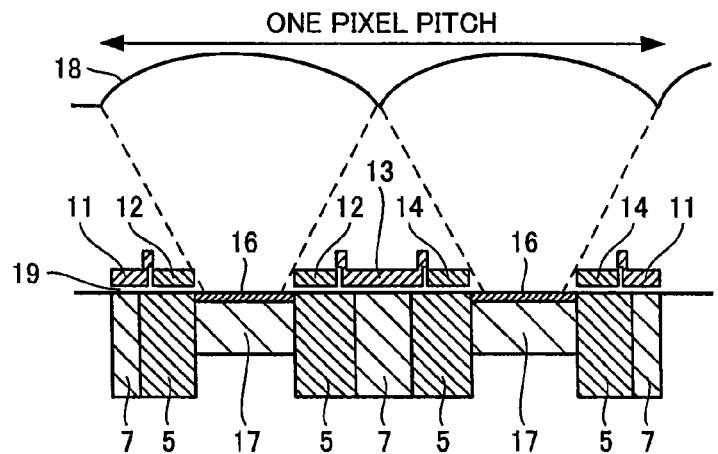
FIG. 31 is a diagram of a cross-sectional structure in a B cross-section of the TDI-type linear image sensor according to Embodiment 6 of the present invention.

FIG. 28 is a schematic plan view showing a circuit configuration of the TDI-type linear image sensor in Embodiment 6. FIG. 29 is an enlarged plan view of the TDI-type linear image sensor in Embodiment 6. FIG. 30 is a diagram of a cross-sectional structure in an A cross-section shown in FIG. 29, of the TDI-type linear image sensor in Embodiment 6. FIG. 31 is a diagram of a cross-sectional structure in a B cross-section shown in FIG. 29, of the TDI-type linear image sensor in Embodiment 6.

Referring to FIG. 28, in TDI-type linear image sensor 100, pixels P and pixels for transfer TP are provided in rows and columns on the surface of semiconductor substrate 30. Semiconductor substrate 30 is, for example, an Si (silicon) substrate.

A pixel region in which pixels P and pixels for transfer TP are arranged in rows and columns is divided into light reception portion 39 and transfer portion 40. Light reception portion 39 is a region where pixels P are arranged in rows and columns and a range shown with an arrow in FIG. 28 represents a range of light reception portion 39 in vertical direction D1. Transfer portion 40 is a region where pixels for transfer TP are arranged in rows and columns, and a range shown with an arrow in FIG. 28 represents a range of transfer portion 40 in vertical direction D1. Light reception portion 39 and transfer portion 40 are provided on semiconductor substrate 30 adjacent to each other. FIG. 28 shows a portion corresponding to pixels P and pixels for transfer TP, for each pixel, in a quadrangle shown with a bold line. In the example shown in FIG. 28, pixels P of 6 vertical pixels×10 horizontal pixels are arranged in rows and columns in light reception portion 39, and pixels for transfer TP of 2 vertical pixels×10 horizontal pixels are arranged in rows and columns in transfer portion 40.

Pixel P is formed from photodetectors photoelectrically converting incident light and generating signal charges.

Pixel P has transfer electrode 49 extending in horizontal direction D2, in which four electrodes are juxtaposed in vertical direction D1. Transfer electrode 49 forms a vertical transfer gate transferring signal charges generated in pixel P to charge accumulation portion 44. Transfer electrode 49 has first TDI transfer gate electrode 31, second TDI transfer gate electrode 32, third TDI transfer gate electrode 33, and fourth TDI transfer gate electrode 34. Thus, 4-phase drive can be achieved. Each of first TDI transfer gate electrode 31, second TDI transfer gate electrode 32, third TDI transfer gate electrode 33, and fourth TDI transfer gate electrode 34 has a gate non-opening portion forming TDI transfer channel 15 shown in FIG. 29 and gate-opening-portion-embedding photodiode 10.

Pixel for transfer TP has transfer electrode 50 extending in horizontal direction D2, in which four electrodes are juxtaposed in vertical direction D1. Transfer electrode 50 forms a vertical transfer gate transferring signal charges generated in pixel P to charge accumulation portion 44. Transfer electrode 50 has first transfer gate electrode 35, second transfer gate electrode 36, third transfer gate electrode 37, and fourth transfer gate electrode 38. Though not shown, a light cut-off film is provided above pixel for transfer TP such that light from a subject is not incident.

Pixel for transfer TP is different from pixel P in not having gate-opening-portion-embedding photodiode 10.

First TDI transfer gate electrode 31, second TDI transfer gate electrode 32, third TDI transfer gate electrode 33, fourth TDI transfer gate electrode 34, first transfer gate electrode 35, second transfer gate electrode 36, third transfer gate electrode 37, and fourth transfer gate electrode 38 are formed, for example, of polysilicon (polycrystalline silicon) or the like. In the present embodiment, second TDI transfer gate electrode 32, fourth TDI transfer gate electrode 34, second transfer gate electrode 36, and fourth transfer gate electrode 38 are formed from a first polysilicon layer. In addition, first TDI transfer gate electrode 31, third TDI transfer gate electrode 33, first transfer gate electrode 35, and third transfer gate electrode 37 are formed from a second polysilicon layer.

Vertical transfer clocks for drive φ1, φ2, φ3, φ4 provided from input pins 55a, 55b, 55c, 55d are provided to pixels P and pixels for transfer TP through lines 52a, 52b, 52c, 52d, contacts 53a, 53b, 53c, 53d, and lines 54a, 54b, 54c, 54d. Here, lines, contacts, and input pins common in suffix a, b, c, d are connected.

Line 54a is electrically connected to first TDI transfer gate electrode 31 and first transfer gate electrode 35. Line 54b is electrically connected to second TDI transfer gate electrode 32 and second transfer gate electrode 36. Line 54c is electrically connected to third TDI transfer gate electrode 33 and third transfer gate electrode 37. Line 54d is electrically connected to fourth TDI transfer gate electrode 34 and fourth transfer gate electrode 38.

At an end on a side of transfer portion 40, of a pixel region including light reception portion 39 and transfer portion 40, horizontal CCD 43 is provided, and charge accumulation portion 44 is provided between the pixel region and horizontal CCD 43. At an end opposite to horizontal CCD 43, charge release portion 45 for releasing excessive charges is provided. Output amplifier 46 is connected to horizontal CCD 43.

A structure of pixel P will be described mainly with reference to FIG. 29. Pixel P is formed from 4-phase CCDs constituted of first TDI transfer gate 11, second TDI transfer gate 12, third TDI transfer gate 13, and fourth TDI transfer gate 14. First to fourth TDI transfer gates 11 to 14 each have a gate non-opening portion region directly under which TDI transfer channel 15 is formed and gate-opening-embedding photodiode 10 within one pixel pitch.

In the TDI transfer direction which is a column direction and in a direction perpendicular to TDI transfer which is a row direction, gate-opening-embedding photodiodes 10 are formed at a pitch of ½ of a pixel pitch, a column of gate-opening-embedding photodiodes 10 adjacent to one another is arranged as displaced by ¼ of the pixel pitch in the TDI transfer direction, and one pixel is formed by gate-opening-embedding photodiodes 10 in two rows and two columns. Transfer channel 15 extends in the TDI transfer direction with two columns of gate-opening-embedding photodiodes 10 being interposed.

In addition, transfer channel 15 and charge release (overflow) drain 6 formed from the high-concentration impurity region of the second conductivity type are formed between two columns of gate-opening-portion-embedding photodiodes 10 adjacent to each other, so as to extend alternately in the TDI transfer direction. Impurity region 7 of the first conductivity type is formed directly under the TDI transfer gate region of regions for TDI transfer gates 11 to 14, which lies between transfer channel 15 and charge release (overflow) drain 6 and in which no gate-opening-embedding photodiode 10 is formed. In addition, in a region except for gate-opening-embedding photodiode 10, transfer channel 15, charge release (overflow) drain 6, and impurity region 7 of the first conductivity type, channel stop 5 formed from the high-concentration impurity region of the first conductivity type is formed.

A gate length in the TDI transfer direction of TDI transfer gates 11 to 14 of each phase is extended only in the vicinity of gate-opening-embedding photodiode 10.

For all of four TDI transfer gate electrodes of the 4-phase CCDs constituting the pixels, a gate opening portion and a gate non-opening portion serving as TDI transfer channel 15 are formed. Embedding photodiode 10 is formed in the gate opening portion. Embedding photodiode 10 is constituted of high-concentration impurity region 16 of the first conductivity type formed in the surface of the silicon substrate and impurity region 17 of the second conductivity type formed in contact with high-concentration impurity region 16 of the first conductivity type in a deeper region of the silicon substrate.

Four microlenses 18 equal in number to the phases constituting the pixels of the CCDs are formed within one pixel pitch so as to gather light onto gate-opening-portion-embedding photodiode 10 of each phase. Namely, in the TDI transfer direction which is a column direction and in a direction perpendicular to TDI transfer which is a row direction, microlenses are formed at a pitch of ½ of a pixel pitch, and a column of microlenses adjacent to one another is arranged as displaced by ¼ of the pixel pitch in the TDI transfer direction such that light is gathered onto the gate opening portion. Therefore, sensitivity can be improved by gathering light onto the gate opening portion with the microlens, without causing lowering in MTF in the TDI transfer direction.

In addition, high-concentration impurity region 16 of the first conductivity type of gate-opening-portion-embedding photodiode 10 is in contact, at an arbitrary portion, with channel stop 5 formed from the high-concentration impurity region of the first conductivity type. Thus, lower noise can be realized.

Moreover, the gate opening portions of two adjacent pixels are not connected to each other at any portion.

In addition, as shown in FIG. 29, a gate length in a transfer direction, of the TDI transfer gate of each phase is extended only in the vicinity of the gate opening portion. An opening length of the gate opening portion in the TDI transfer direction can thus be longer and sensitivity is improved. As shown in FIG. 30, charge release (overflow) drain 6 is not linearly formed in the TDI transfer direction but is formed to be away from the gate opening portion in a direction perpendicular to the TDI transfer direction directly under the TDI transfer gate of each phase. Thus, a large width of channel stop 5 formed from the high-concentration impurity region of the first conductivity type, as lying between gate-opening-portion-embedding photodiode 10 and charge release (overflow) drain 6, can be ensured, and a withstand voltage between gate-opening-portion-embedding photodiode 10 and charge release (overflow) drain 6 is improved.

Moreover, a side of the gate opening portion of each phase which is not in contact with the charge transfer channel has a corner beveled as shown in FIG. 29. Thus, a large width of channel stop 5 formed from the high-concentration impurity region of the first conductivity type as lying between the gate opening portion and charge release (overflow) drain 6 can be ensured, and a withstand voltage between gate-opening-portion-embedding photodiode 10 and charge release (overflow) drain 6 is improved.

In the description above, a P-type Si substrate, an N-type impurity region, a high-concentration P-type impurity region, and an N-type impurity region are applicable as semiconductor substrate 30, TDI transfer channel 15, high-concentration impurity region 16 of the first conductivity type, and impurity region 17 of the second conductivity type, respectively.

Microlens 18 may be fabricated independently of pixel P and may be bonded above pixel P.

Alternatively, microlens 18 may directly be formed on pixel P with the use of a semiconductor technique.

(Operation of Pixel)

Figure 32:
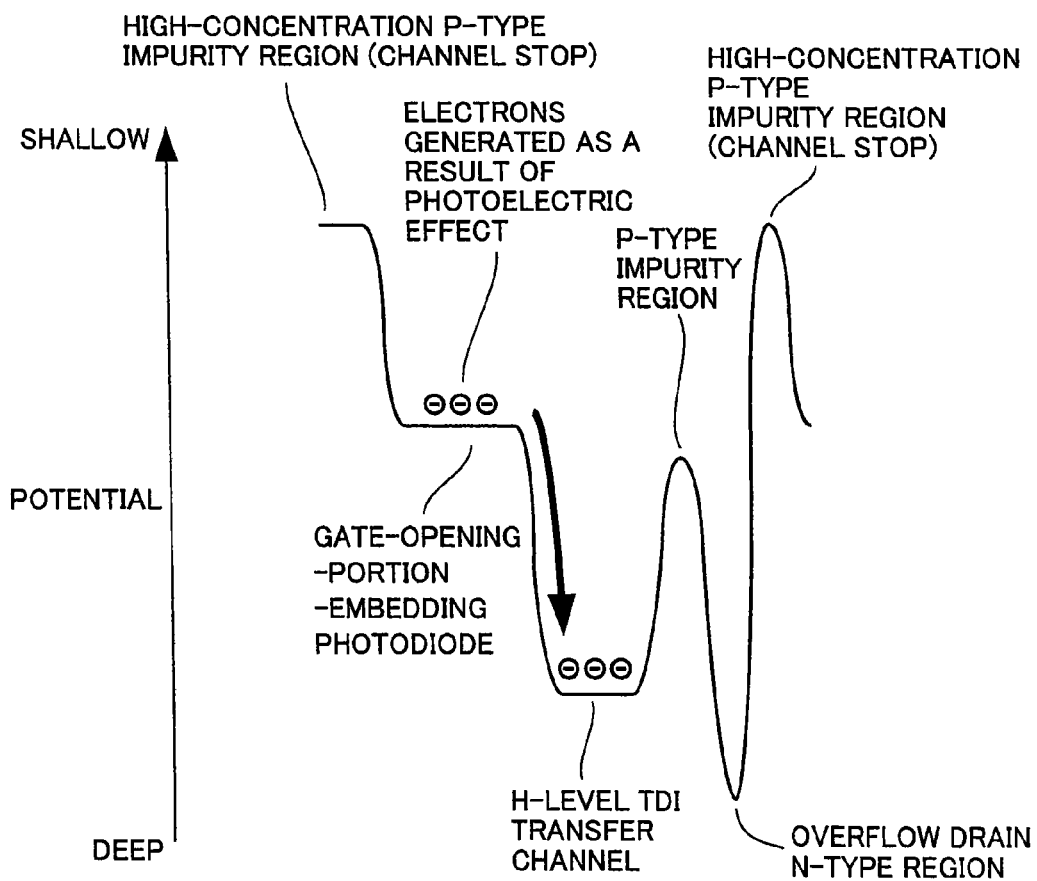
FIG. 32 is a diagram of a potential in the A cross-section of the TDI-type linear image sensor according to Embodiment 6 of the present invention.
Figure 33:
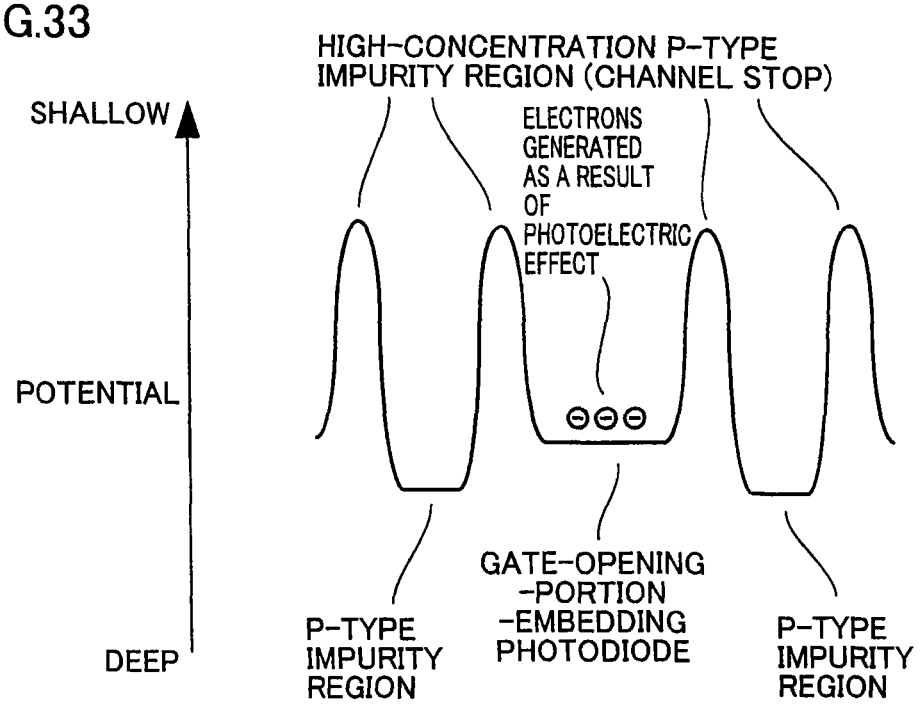
FIG. 33 is a diagram of a potential in the B cross-section of the TDI-type linear image sensor according to Embodiment 6 of the present invention.

FIG. 32 is a diagram of one-dimensional distribution in a cross-section, of a potential in an A cross-section shown in FIG. 29, of the TDI-type linear image sensor in Embodiment 6. FIG. 33 is a diagram of one-dimensional distribution in a cross-section, of a potential in a B cross-section shown in FIG. 29, of the TDI-type linear image sensor in Embodiment 6. Here, potential distribution diagrams in FIGS. 32 and 33 show a case that a P-type Si substrate and an N-type impurity region are applied as semiconductor substrate 30 and TDI transfer channel 15, respectively.

An operation of a pixel in the present embodiment will be described with reference to the diagrams of a potential of pixel P in FIGS. 32 and 33. Microlens 18 formed for each phase within one pixel gathers light incident on the pixel onto corresponding gate-opening-portion-embedding photodiode 10 for each phase. In gate-opening-portion-embedding photodiode 10, charges are generated as a result of photoelectric conversion.

Here, a potential of gate-opening-portion-embedding photodiode 10 is set to be shallower than a potential while TDI transfer channel 15 is at the High level (when a voltage of the High level is applied to the TDI transfer gate). On the other hand, a potential of gate-opening-portion-embedding photodiode 10 may be set to be shallower or deeper than a potential while TDI transfer channel 15 is at the Low level (when a Low voltage is applied to the TDI transfer gate).

Therefore, in horizontal direction D2, as shown in FIG. 32, charges generated in gate-opening-portion-embedding photodiode 10 flow into a potential well of the TDI transfer channel at the High level. As can be seen in the diagram of the potential in the diagram of one-dimensional distribution in the cross-section in vertical direction D1 in FIG. 33, charges generated in gate-opening-portion-embedding photodiode 10 do not flow into channel stop 5 shallow in potential, which is formed from the high-concentration impurity region of the first conductivity type, but all flow into a potential well in the High-level TDI transfer channel.

In the case that a potential while TDI transfer channel 15 is at the Low level is set to be shallower than a potential of gate-opening-portion-embedding photodiode 10, while corresponding TDI transfer channel 15 is at the Low level, gate-opening-portion-embedding photodiode 10 serves as a potential well, generated charges remain in this potential well, and they flow into the potential well of the TDI transfer channel at the High level at the timing when corresponding TDI transfer channel 15 attains to the High level. Charges which flowed in the potential well of the TDI transfer channel at the High level are TDI-transferred within a TDI transfer channel directly under the gate non-opening portion through a transfer operation by the 4-phase drive CCDs.

In the case that a potential while TDI transfer channel 15 is at the Low level is set to be deeper than a potential of gate-opening-portion-embedding photodiode 10, charges generated in gate-opening-portion-embedding photodiode 10 flow into the TDI transfer channel at the Low level and TDI-transferred within the TDI transfer channel directly under the gate non-opening portion through a transfer operation by the 4-phase drive CCDs.

(Transfer Operation)

A transfer operation in TDI-type linear image sensor 100 will now be described. Referring again to FIG. 28, signal charges generated in the inside of pixel P as a result of photoelectric conversion of incident light are transferred in vertical direction D1 through a time delay and integration (TDI) operation. Signal charges subjected to time delay and integration (TDI) in light reception portion 39 are transferred through transfer portion 40 toward charge accumulation portion 44 in vertical direction D1. Signal charges once accumulated in charge accumulation portion 44 are transferred to horizontal CCD 43 for each horizontal period, and then transferred within horizontal CCD 43 in horizontal direction D2 and read from output amplifier 46.

(Effect)

As in Embodiment 1, the present embodiment can solve the problem specific to a TDI-type linear image sensor, that is, lowering in MTF in a TDI transfer direction caused by gathering of light onto an electrode of one phase, at the time when a microlens is mounted on a TDI-type linear image sensor, without impairing an effect of improvement in sensitivity by the microlens.

Namely, according to the present embodiment, the microlens formed in each phase gathers incident light onto a gateopening-portion-embedding photodiode, light absorption by a polysilicon layer which is a gate electrode is suppressed, and significant improvement in sensitivity is realized. At the same time, since light incident above an electrode region of each phase is gathered onto a region of each phase, lowering in MTF in a TDI transfer direction does not take place, and a TDI-type linear image sensor of high performance can be provided.

In addition, in Embodiment 1, a radius of curvature of the microlens in the TDI transfer direction (vertical direction D1) should be greater than a radius of curvature in a direction perpendicular to TDI transfer (horizontal direction D2), and difficulty in manufacturing was high. In the microlens in the present embodiment, however, a radius of curvature in the TDI transfer direction (vertical direction D1) can be equal to a radius of curvature in a direction perpendicular to TDI transfer (horizontal direction D2), and manufacturing is facilitated.

Embodiment 7

Figure 34:
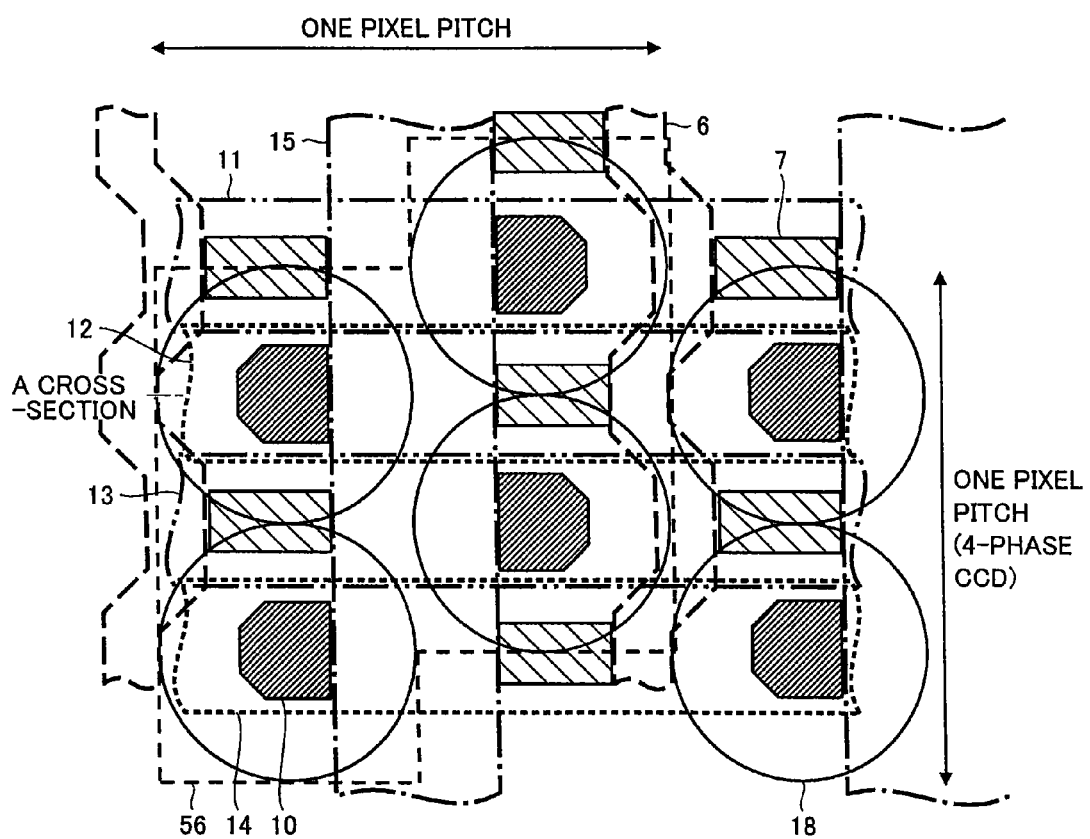
FIG. 34 is a plan view of an element in a TDI-type linear image sensor according to Embodiment 7 of the present invention.

FIG. 34 is a plan view of an element in a TDI-type linear image sensor according to Embodiment 7 of the present invention.

In Embodiment 6, a gate length of the TDI transfer gate of each phase in a transfer direction is extended only in the vicinity of the gate opening portion, as shown in FIG. 29.

In Embodiment 7, as shown in FIG. 34, the TDI transfer gate of each phase is formed linearly in a direction perpendicular to the TDI transfer direction. With this configuration, as compared with the configuration that a gate length in the transfer direction is extended only in the vicinity of the gate opening portion as in Embodiment 6, a gate length of a narrow portion of the TDI transfer gate in the gate opening portion is short. Consequently, though difficulty in manufacturing of a narrow portion of the TDI transfer gate may become high, such an effect as avoiding lowering in MTF in the TDI transfer direction and improving sensitivity is achieved.

Embodiment 8

Figure 35:
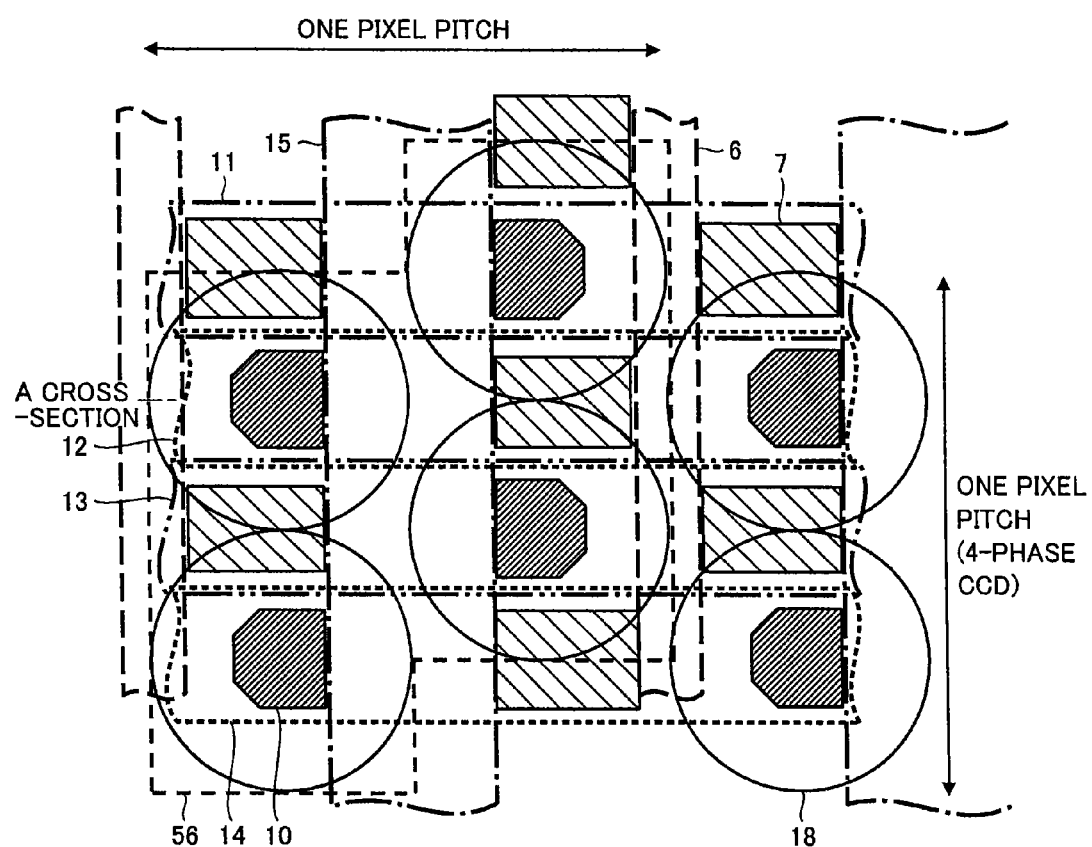
FIG. 35 is a plan view of an element in a TDI-type linear image sensor according to Embodiment 8 of the present invention.

FIG. 35 is a plan view of an element in a TDI-type linear image sensor according to Embodiment 8 of the present invention.

In Embodiment 6, as shown in FIG. 30, charge release (overflow) drain 6 is not formed linearly in the TDI transfer direction but is formed to be away from the gate opening portion in a direction perpendicular to the TDI transfer direction directly under the TDI transfer gate of each phase.

In contrast, in Embodiment 8, as shown in FIG. 35, charge release (overflow) drain 6 is formed linearly in the TDI transfer direction. With this configuration, as compared with the case of formation to be away from the gate opening portion in the direction perpendicular to the TDI transfer direction directly under each TDI transfer gate as in Embodiment 6, though a withstand voltage of gate-opening-portion-embedding photodiode 10 and charge release (overflow) drain 6 may slightly be lowered, such an effect as avoiding lowering in MTF in the TDI transfer direction and improving sensitivity is achieved.

Embodiment 9

In Embodiment 6, as shown in FIG. 30, impurity regions 7 of the first conductivity type are formed at a pitch of ½ of a pixel pitch in the direction perpendicular to TDI transfer which is a row, and a column of impurity regions 7 of the first conductivity type adjacent to one another is arranged as displaced by ¼ of the pixel pitch in the TDI transfer direction.

In an operation of the 4-phase CCDs, however, two TDI transfer gates of respective phases simultaneously attain to the High level, and hence it is not necessary to form impurity region 7 of the first conductivity type for all of the TDI transfer gates of respective phases and impurity region 7 of the first conductivity type may be formed every other TDI transfer gate of each phase.

Figure 36:
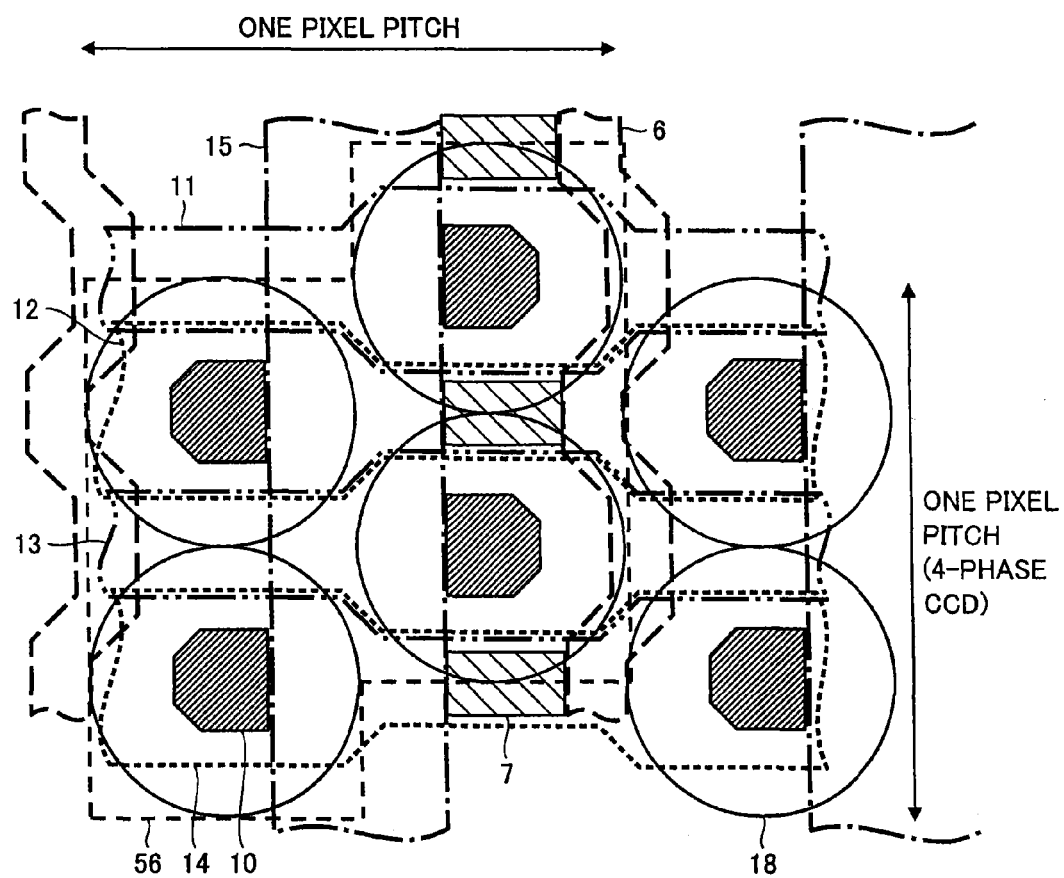
FIG. 36 is a plan view of an element in a TDI-type linear image sensor according to Embodiment 9 of the present invention.

FIG. 36 is a plan view of an element in a TDI-type linear image sensor according to Embodiment 9 of the present invention.

In FIG. 36, impurity regions 7 of the first conductivity type formed at a pitch of ½ of the pixel pitch in the direction perpendicular to TDI transfer which is a row in FIG. 30 are replaced with channel stop 5 formed from the high-concentration impurity region of the first conductivity type for every other column, instead of impurity region 7 of the first conductivity type.

In FIG. 36, in a region except for gate-opening-embedding photodiode 10, transfer channel 15, charge release (overflow) drain 6, and impurity region 7 of the first conductivity type, channel stop 5 formed from the high-concentration impurity region of the first conductivity type is formed. In the case of FIG. 36 as well, such an effect as avoiding lowering in MTF in the TDI transfer direction and improving sensitivity is achieved.

Embodiment 10

Figure 37:
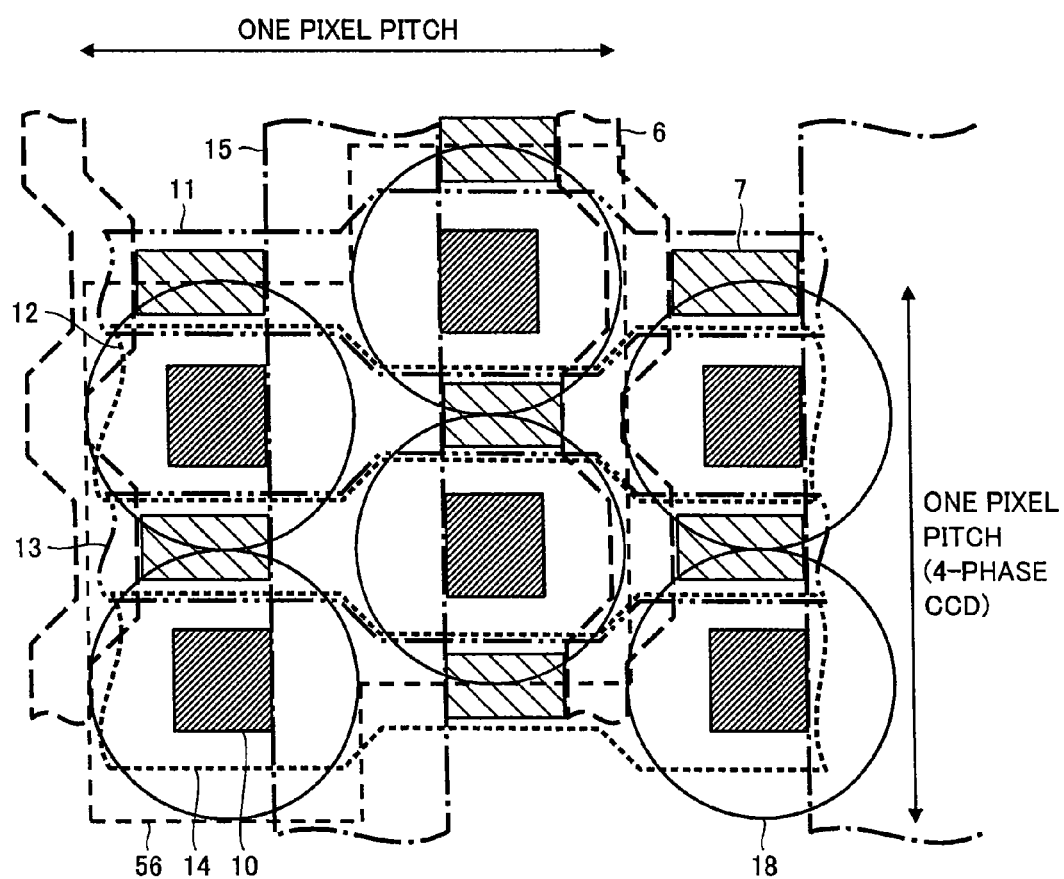
FIG. 37 is a plan view of an element in a TDI-type linear image sensor according to Embodiment 10 of the present invention.

FIG. 37 is a plan view of an element in a TDI-type linear image sensor according to Embodiment 10 of the present invention.

In Embodiment 6, as shown in FIG. 29, a side of the gate opening portion of each phase which is not in contact with the charge transfer channel has a corner beveled.

In Embodiment 10, as shown in FIG. 37, a side of gate-opening-portion-embedding photodiode 10 of each phase which is not in contact with the charge transfer channel does not have a corner beveled. With this configuration, a width of channel stop 5 formed from the high-concentration impurity region of the first conductivity type which is formed to lie between the gate opening portion and charge release (overflow) drain 6 is slightly shorter. Consequently, though a withstand voltage between the gate opening portion and charge release (overflow) drain 6 may slightly lower, such an effect as avoiding lowering in MTF in the TDI transfer direction and improving sensitivity is achieved.

Embodiment 11

Figure 38:
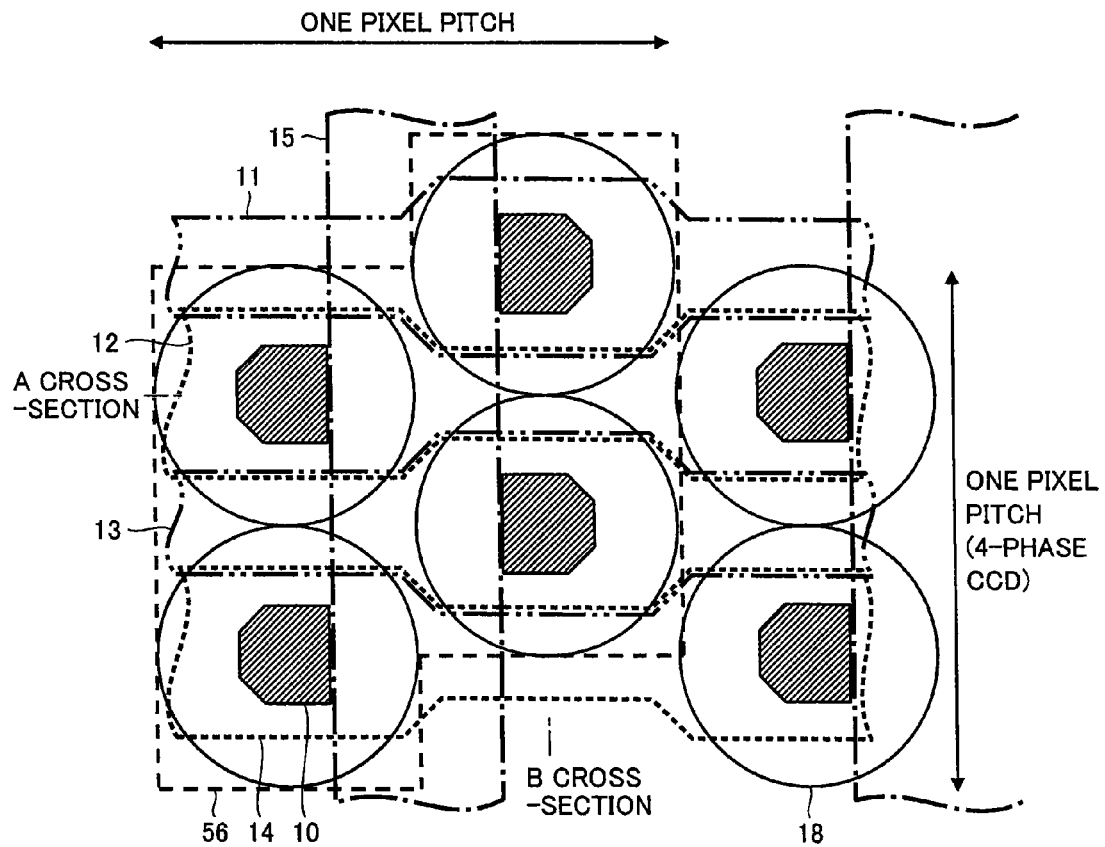
FIG. 38 is a plan view of an element in a TDI-type linear image sensor according to Embodiment 11 of the present invention.
Figure 39:
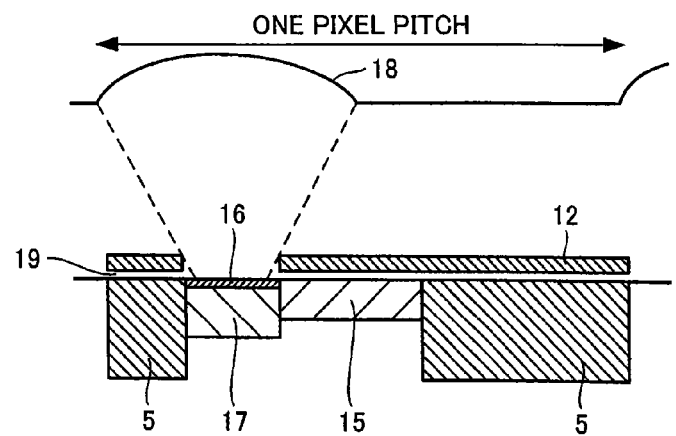
FIG. 39 is a diagram of a cross-sectional structure in an A cross-section of the TDI-type linear image sensor according to Embodiment 11 of the present invention.
Figure 40:
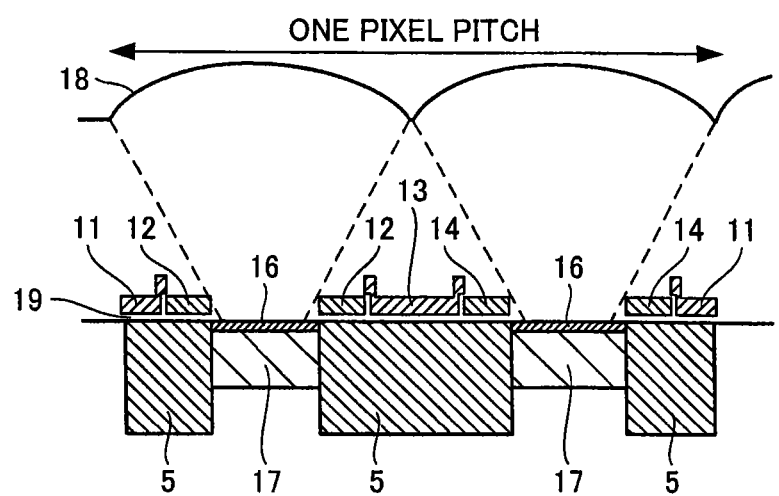
FIG. 40 is a diagram of a cross-sectional structure in a B cross-section of the TDI-type linear image sensor according to Embodiment 11 of the present invention.

FIG. 38 is an enlarged plan view of a TDI-type linear image sensor in Embodiment 11. FIG. 39 is a diagram of a cross-sectional structure in an A cross-section shown in FIG. 38, of the TDI-type linear image sensor in Embodiment 11. FIG. 40 is a diagram of a cross-sectional structure in a B cross-section shown in FIG. 38, of the TDI-type linear image sensor in Embodiment 11.

As shown in FIGS. 38 to 40, in Embodiment 11, a configuration in which no lateral overflow drain is formed is employed.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 1 first TDI transfer gate; 2 second TDI transfer gate; 3 VPCCD virtual electrode; 4 third TDI transfer gate; 5 channel stop; 6 charge release drain; 7 impurity region of first conductivity type; 8 microlens; 9 optical axis; 10 gate-opening-embedding photodiode; 11 first TDI transfer gate; 12 second TDI transfer gate; 13 third TDI transfer gate; 14 fourth TDI transfer gate; 15 TDI transfer channel region; 16 high-concentration impurity region of first conductivity type of gate-opening-embedding photodiode; 17 impurity region of second conductivity type of gate-opening-embedding photodiode; 18 microlens; 19 gate oxide film; 20 gate narrowed portion; 21 first TDI transfer gate of 3-phase CCD; 22 second TDI transfer gate of 3-phase CCD; 23 third TDI transfer gate of 3-phase CCD; 24 gate pile drive aluminum interconnection; 25 gate contact; 30 semiconductor substrate; 31 first TDI transfer gate electrode; 32 second TDI transfer gate electrode; 33 third TDI transfer gate electrode; 34 fourth TDI transfer gate electrode; 35 first transfer gate electrode; 36 second transfer gate electrode; 37 third transfer gate electrode; 38 fourth transfer gate electrode; 39 light reception portion; 40 transfer portion; 41 pixel isolation region; 42 pixel for transfer; 43 horizontal CCD; 44 charge accumulation portion; 45 charge release portion; 46 output amplifier; 49 transfer electrode; 50 transfer electrode; 52$a$, 52$b$, 52$c$, 52$d$ line; 53$a$, 53$b$, 53$c$, 53$d$ contact; 54$a$, 54$b$, 54$c$, 54$d$ line; 55$a$, 55$b$, 55$c$, 55$d$ input pin; 56 pixel; 60 gate opening channel stop; and 100 TDI-type linear image sensor.

The invention claimed is:

1. A TDI-type linear image sensor comprising:
plural pixels, each constituted of n phases (n being an integer not smaller than 3), each phase of each pixel comprising
a gate opening portion and a gate non-opening portion functioning as a TDI transfer channel formed in a transfer gate of the respective phase of the respective pixel,
a separate microlens being formed such that light is gathered onto the gate opening portion of the respective phase of the respective pixel.

2. The TDI-type linear image sensor according to claim 1, wherein
the gate opening portions of two adjacent pixels are not connected to each other at any portion.

3. The TDI-type linear image sensor according to claim 1, wherein
an embedding photodiode is formed in the gate opening portion formed in the transfer gate of each phase, and said embedding photodiode is formed from a high-concentration impurity region of a first conductivity type formed in a surface of a silicon substrate and an impurity region of a second conductivity type formed in contact with said high-concentration impurity region of the first conductivity type in a deeper region of the silicon substrate.

4. The TDI-type linear image sensor according to claim 3, wherein
said high-concentration impurity region of the first conductivity type of said embedding photodiode is in contact with the impurity region of the first conductivity type formed between said gate opening portion and the gate non-opening portion of an adjacent pixel.

5. The TDI-type linear image sensor according to claim 3, wherein
the impurity region of the first conductivity type is formed between embedding photodiodes formed in the gate opening portions of two adjacent pixels.

6. The TDI-type linear image sensor according to claim 3, wherein
the transfer gates of two adjacent pixels are disconnected from each other,
the TDI-type linear image sensor further comprises:
a metal interconnection provided directly above said TDI transfer channel; and
a gate contact connecting said metal interconnection and said transfer gate to each other, and
a voltage is supplied through said metal interconnection and said gate contact.

7. The TDI-type linear image sensor according to claim 3, wherein
the embedding photodiodes formed in the gate opening portions of the two adjacent pixels are connected to each other through the impurity region of the first conductivity type.

8. The TDI-type linear image sensor according to claim 1, wherein
said microlens has a radius of curvature in the TDI transfer direction greater than a radius of curvature in a direction perpendicular to said TDI transfer direction.

9. The TDI-type linear image sensor according to claim 1, wherein
said n is set to 4,
said gate opening portion is formed at a pitch of ½ of a pixel pitch in said TDI transfer direction which is a column direction and a direction perpendicular to said TDI transfer direction which is a row direction,
a column of said gate opening portions adjacent to one another is arranged as displaced by ¼ of the pixel pitch in said TDI transfer direction,
one pixel is formed by said gate opening portions in two rows and two columns, and
a transfer channel extends in the TDI transfer direction with said gate opening portions in the two columns being interposed.

10. The TDI-type linear image sensor according to claim 9, wherein
said microlenses are formed at a pitch of ½ of the pixel pitch in said column direction and said row direction, and
the column of the microlenses adjacent to one another is arranged as displaced by ¼ of the pixel pitch in said TDI transfer direction such that light is gathered onto said gate opening portion.

11. The TDI-type linear image sensor according to claim 9, wherein
an embedding photodiode is formed in said gate opening portion formed in the transfer gate of each phase, and said embedding photodiode is formed from a high-concentration impurity region of a first conductivity type formed in a surface of a silicon substrate and an impurity region of a second conductivity type formed in contact with said high-concentration impurity region of the first conductivity type in a deeper region of the silicon substrate.

12. The TDI-type linear image sensor according to claim 9, wherein
a gate length of the TDI transfer gate of each phase is extended in the transfer direction only around said gate opening portion.

13. The TDI-type linear image sensor according to claim 9, wherein
said transfer channel and the impurity region of the second conductivity type are formed between the gate opening portions in two columns adjacent to each other, so as to extend alternately in said TDI transfer direction.

14. The TDI-type linear image sensor according to claim 13, wherein
the impurity region of the first conductivity type is formed directly under a TDI transfer gate region where no said gate opening portion is formed, of TDI transfer gate regions lying between said transfer channel and said impurity region of the second conductivity type.

15. The TDI-type linear image sensor according to claim 14, wherein
the high-concentration impurity region of the first conductivity type is formed in a region except for said gate opening portion, said transfer channel, said impurity region of the second conductivity type, and said impurity region of the first conductivity type.

16. The TDI-type linear image sensor according to claim 9, wherein
the impurity region of the first conductivity type is formed in a region except for said gate opening portion and said transfer channel.

\* \* \* \* \*